United States Patent
Kato et al.

(10) Patent No.: US 11,674,225 B2
(45) Date of Patent: Jun. 13, 2023

(54) SUBSTRATE PROCESSING APPARATUS

(71) Applicant: TOKYO ELECTRON LIMITED, Tokyo (JP)

(72) Inventors: Hitoshi Kato, Oshu (JP); Yukio Ohizumi, Oshu (JP); Manabu Honma, Oshu (JP); Takeshi Kobayashi, Oshu (JP)

(73) Assignee: TOKYO ELECTRON LIMTED, Tokyo (JP)

( * ) Notice: Subject to any disclaimer, the term of this patent is extended or adjusted under 35 U.S.C. 154(b) by 892 days.

(21) Appl. No.: 15/862,190

(22) Filed: Jan. 4, 2018

(65) Prior Publication Data
US 2018/0195173 A1 Jul. 12, 2018

(30) Foreign Application Priority Data
Jan. 11, 2017 (JP) .............................. JP2017002881

(51) Int. Cl.
*C23C 16/455* (2006.01)
*C23C 16/458* (2006.01)
(Continued)

(52) U.S. Cl.
CPC .... *C23C 16/45551* (2013.01); *B05C 11/1031* (2013.01); *C23C 14/042* (2013.01);
(Continued)

(58) Field of Classification Search
CPC . B05C 11/1031; C23C 14/042; C23C 14/228; C23C 14/26; C23C 14/505;
(Continued)

(56) References Cited

U.S. PATENT DOCUMENTS 2,722,617 A * 11/1955 Meyer .................. H02K 49/102
310/103
3,336,898 A * 8/1967 Simmons ................ C23C 14/22
118/720
(Continued)

FOREIGN PATENT DOCUMENTS

CN 105568259 A * 5/2016 ........ H01J 37/32926
CN 105603391 A 5/2016
(Continued)

OTHER PUBLICATIONS

"Chapter 1: Computers and Industrial Control." in E. A. Parr. "Programmable Controllers, Third Edition: An Engineer's Guide." Elsevier Ltd. 2003. pp. 1-32. (Year: 2003).*
(Continued)

*Primary Examiner* — Jeffrie R Lund
(74) *Attorney, Agent, or Firm* — Nath, Goldberg & Meyer; Jerald L. Meyer; Tanya E. Harkins

(57) ABSTRACT

There is provided a substrate processing apparatus for performing film formation by supplying a processing gas to a substrate, including: a rotary table provided in a processing container; a mounting stand provided to mount the substrate and configured to be revolved by rotating the rotary table; a processing gas supply part configured to supply a processing gas to a region through which the mounting stand passes by the rotation of the rotary table; a rotation shaft rotatably provided in a portion rotating together with the rotary table and configured to support the mounting stand; a driven gear provided on the rotation shaft; a driving gear provided along an entire circumference of a revolution trajectory of the driven gear to face the revolution trajectory of the driven gear and configured to constitute a magnetic gear mechanism with the driven gear; and a rotating mechanism configured to rotate the driving gear.

6 Claims, 18 Drawing Sheets

(51) Int. Cl.

| | | |
|---|---|---|
| C23C 16/52 | (2006.01) | |
| C23C 14/50 | (2006.01) | |
| C23C 14/04 | (2006.01) | |
| H01L 21/304 | (2006.01) | |
| H01L 21/67 | (2006.01) | |
| H01L 21/687 | (2006.01) | |
| C23C 14/26 | (2006.01) | |
| C23C 14/22 | (2006.01) | |
| B05C 11/10 | (2006.01) | |
| C23C 16/40 | (2006.01) | |

(52) U.S. Cl.
 CPC ............ *C23C 14/228* (2013.01); *C23C 14/26* (2013.01); *C23C 14/505* (2013.01); *C23C 16/402* (2013.01); *C23C 16/4584* (2013.01); *C23C 16/45546* (2013.01); *C23C 16/52* (2013.01); *H01L 21/304* (2013.01); *H01L 21/67051* (2013.01); *H01L 21/67126* (2013.01); *H01L 21/68764* (2013.01); *H01L 21/68771* (2013.01); *H01L 21/68792* (2013.01)

(58) Field of Classification Search
 CPC .............. C23C 16/402; C23C 16/4408; C23C 16/4409; C23C 16/45527; C23C 16/45536; C23C 16/45542; C23C 16/45544; C23C 16/45546; C23C 16/45551; C23C 16/45585; C23C 16/4584; C23C 16/48586; C23C 16/52; H01J 37/321; H01J 37/3244; H01J 37/32715; H01J 37/32733; H01J 37/32779; H01J 37/32926; H01J 21/304; H01J 21/67051; H01J 21/67126; H01J 21/67253; H01J 21/68764; H01J 21/68771; H01J 21/68785; H01J 21/68792

See application file for complete search history.

(56) References Cited

U.S. PATENT DOCUMENTS

| | | | | |
|---|---|---|---|---|
| 3,378,710 A * | 4/1968 | Martin, Jr. | ............ | H02K 49/102 310/104 |
| 3,422,297 A * | 1/1969 | de Bennetot | ......... | C23C 14/505 310/80 |
| 3,644,910 A * | 2/1972 | Dirks | ........ | G11B 5/02 369/59.21 |
| 3,977,524 A * | 8/1976 | Boots | ......... | G01B 5/10 209/912 |
| 5,713,405 A * | 2/1998 | Kashiwagi | ........... | B23Q 1/5468 192/84.3 |
| 5,795,448 A * | 8/1998 | Hurwitt | ............... | H01L 21/6715 118/729 |
| 6,183,615 B1 * | 2/2001 | Yasar | ................ | H01L 21/67709 204/192.12 |
| 6,454,908 B1 * | 9/2002 | Schertler | ........... | H01L 21/68764 118/719 |
| 10,072,336 B2 * | 9/2018 | Kato | ................ | H01L 21/68764 |
| 10,221,480 B2 * | 3/2019 | Kato | ................ | H01L 21/68792 |
| 10,246,775 B2 * | 4/2019 | Kato | ................ | C23C 16/45542 |
| 10,584,416 B2 * | 3/2020 | Kato | ................ | H01L 21/68764 |
| 10,683,573 B2 * | 6/2020 | Kato | ................ | C23C 16/45551 |
| 11,248,294 B2 * | 2/2022 | Kato | ................ | C23C 16/52 |
| 11,422,008 B2 * | 8/2022 | Kobayashi | ........ | C23C 16/45551 |
| 2001/0051499 A1 * | 12/2001 | Shinozaki | ........ | H01L 21/68792 451/285 |
| 2002/0170571 A1 * | 11/2002 | Egashira | ........... | H01L 21/67303 156/345.55 |
| 2003/0029384 A1 * | 2/2003 | Nishikawa | .............. | C30B 25/12 118/730 |
| 2003/0097985 A1 * | 5/2003 | Kitazawa | .......... | H01J 37/32834 118/715 |
| 2004/0041479 A1 * | 3/2004 | French | ................. | H02K 49/102 310/105 |
| 2006/0081468 A1 * | 4/2006 | Seddon | ............. | H01L 21/68785 204/298.27 |
| 2010/0043712 A1 * | 2/2010 | Tobe | ................. | H01L 21/67721 118/728 |
| 2010/0050943 A1 * | 3/2010 | Kato | ..................... | C23C 16/401 118/730 |
| 2010/0114443 A1 * | 5/2010 | Terwart | ................. | F16H 61/688 701/68 |
| 2010/0227059 A1 * | 9/2010 | Kato | ..................... | C23C 16/45551 427/255.28 |
| 2010/0289200 A1 * | 11/2010 | Fukui | ..................... | H02K 55/02 269/8 |
| 2010/0322603 A1 * | 12/2010 | Shim | ................. | H01L 21/68785 392/418 |
| 2011/0266902 A1 * | 11/2011 | Whitfield | ............... | B63H 23/22 310/103 |
| 2011/0303527 A1 * | 12/2011 | Hosoya | ................. | C23C 14/352 204/192.15 |
| 2012/0119509 A1 * | 5/2012 | West | ........ | B60L 50/16 60/624 |
| 2013/0047923 A1 * | 2/2013 | Kato | ................. | C23C 16/4585 118/723 AN |
| 2013/0095973 A1 * | 4/2013 | Kroneberger | ..... | H01L 21/68785 475/149 |
| 2014/0015362 A1 * | 1/2014 | Cheng | ................. | H02K 49/102 310/99 |
| 2015/0018168 A1 * | 1/2015 | Davey | .................... | F16H 35/00 476/11 |
| 2015/0232988 A1 * | 8/2015 | Yamaguchi | ......... | C23C 16/4585 118/697 |
| 2016/0122872 A1 * | 5/2016 | Kato | ........................ | C23C 16/52 427/8 |
| 2016/0138159 A1 * | 5/2016 | Kato | ................. | C23C 16/45551 118/730 |
| 2016/0156254 A1 * | 6/2016 | Bowen | ................. | H02K 16/005 310/68 B |
| 2017/0067160 A1 * | 3/2017 | Kato | ................. | H01L 21/68771 |
| 2017/0198395 A1 * | 7/2017 | Nozawa | ............ | H01J 37/32192 |
| 2017/0218514 A1 * | 8/2017 | Kato | ................. | H01J 37/32779 |
| 2018/0037990 A1 * | 2/2018 | Kato | ................. | H01L 21/0228 |
| 2018/0174880 A1 * | 6/2018 | Swaminathan | ... | H01L 21/67115 |
| 2018/0195173 A1 * | 7/2018 | Kato | ................. | C23C 14/228 |
| 2018/0251892 A1 * | 9/2018 | Kobayashi | .......... | C23C 16/4584 |
| 2018/0327906 A1 * | 11/2018 | Kato | ................. | H01L 21/67253 |
| 2018/0334745 A1 * | 11/2018 | Kato | ................. | H01L 21/68771 |
| 2019/0186004 A1 * | 6/2019 | Kato | ................. | H01L 21/68764 |
| 2019/0360093 A1 * | 11/2019 | Kato | ................. | C23C 16/4584 |
| 2020/0116528 A1 * | 4/2020 | Kobayashi | ............. | B05C 13/00 |
| 2020/0234997 A1 * | 7/2020 | Kato | ................. | H01L 21/02164 |

FOREIGN PATENT DOCUMENTS

| | | | | |
|---|---|---|---|---|
| CN | 107022754 A * | 8/2017 | ......... | C23C 16/4409 |
| JP | 04024916 A * | 1/1992 | .......... | H01L 21/205 |
| JP | 2010212627 A | 9/2010 | | |
| JP | 201692156 A | 5/2016 | | |
| JP | 201696220 A | 5/2016 | | |
| JP | 2018113431 A * | 7/2018 | ......... | B05C 11/1031 |
| JP | 7187385 B2 * | 12/2022 | .......... | C23C 16/401 |
| KR | 1020160051650 A | 5/2016 | | |
| KR | 1020160057322 A | 5/2016 | | |

OTHER PUBLICATIONS

"Chapter 7: Industrial Control with Conventional Computers." in E. A. Parr. "Programmable Controllers, Third Edition: An Engineer's Guide." Elsevier Ltd. 2003. pp. 276-292. (Year: 2003).*

* cited by examiner

SUBSTRATE PROCESSING APPARATUS

CROSS-REFERENCE TO RELATED APPLICATION

This application is based upon and claims the benefit of priority from Japanese Patent Application No. 2017-002881, filed on Jan. 11, 2017, the entire contents of which are incorporated herein by reference.

TECHNICAL FIELD

The present disclosure relates to a technique for performing a film forming process on a substrate mounted on one surface side of a rotary table while making the substrate revolve.

BACKGROUND

In a manufacturing process of a semiconductor device, for example, ALD (Atomic Layer Deposition) is performed in order to form various films for forming an etching mask and the like on a semiconductor wafer (hereinafter referred to as a wafer) which is a substrate. In order to enhance the productivity of the semiconductor device, the aforementioned ALD is often performed by an apparatus that revolves wafers by rotating a rotary table on which a plurality of wafers are mounted and allows the wafers to repeatedly pass through a supply region of a processing gas disposed along the radial direction of the rotary table. Furthermore, CVD (Chemical Vapor Deposition) is often performed in order to form the aforementioned films. Similar to the ALD mentioned above, the film formation by CVD may be performed by revolving the wafers.

In addition, in the film forming process in which the wafers are revolved, a concentric film thickness distribution needs to be formed on the wafer by performing film formation with high uniformity in the circumferential direction of the wafer. One of the reasons is that the etching rate distribution in the radial direction of the wafer can be adjusted during dry etching which is a post-treatment process. As a result, the film thickness uniformity in the plane of the wafer can be improved. Along with the miniaturization of semiconductor devices, the improvement in in-plane uniformity and the achievement of a concentric film thickness distribution are required more than ever.

However, in the film forming apparatus that revolves the wafers, the processing gas is supplied along the radial direction of the rotary table. Therefore, the film thickness distribution formed on the wafer tends to become a film thickness distribution in which the film thickness varies from the center side to the peripheral side of the rotary table. This poses a problem since it is difficult to form a film having high film thickness uniformity in the circumferential direction of the wafer.

One technique utilizes a film forming apparatus that revolves a wafer during a film forming process and performs a uniform film forming process along the circumferential direction of the wafer by rotating the wafer mounted on a rotary table on its own axis. In this technique, the rotation of the wafer is performed using a lifting mechanism used for transferring the wafer to and from the rotary table. In the case where a plurality of wafers is mounted on a rotary table, it is not possible to simultaneously rotate the wafers on their own axes.

In addition, another technique has been used in which a first gear and a second gear are used, and wafers are rotated on their own axes by rotating the second gear with a motor. Particles, however, may be generated due to the contact between the first gear and the second gear. A further technique is also used in which the rotation of a wafer on its own axis is performed by rotating the rotation axis provided in a wafer mounting region with a motor. In the case where a plurality of wafer mounting regions is provided on a rotary table, there is concern that the number of motors increases and the control thereof becomes cumbersome.

SUMMARY

Some embodiments of the present disclosure provide a substrate processing apparatus capable of performing a uniform process along a circumferential direction of a substrate when performing a film forming process on substrates mounted on one side of a rotary table while revolving the substrates.

According to one embodiment of the present disclosure, there is provided a substrate processing apparatus for performing film formation by supplying a processing gas to a substrate, including: a rotary table provided in a processing container; a mounting stand provided to mount the substrate on one surface side of the rotary table and configured to be revolved by rotating the rotary table; a processing gas supply part configured to supply a processing gas to a region through which the mounting stand passes by the rotation of the rotary table; a rotation shaft rotatably provided in a portion rotating together with the rotary table and configured to support the mounting stand; a driven gear provided on the rotation shaft; a driving gear provided along an entire circumference of a revolution trajectory of the driven gear so as to face the revolution trajectory of the driven gear and configured to constitute a magnetic gear mechanism with the driven gear; and a rotating mechanism configured to rotate the driving gear.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, as one embodiment of a substrate processing apparatus according to the present disclosure, a film forming apparatus 1 for executing ALD as a film forming process on a wafer W as a substrate will be described. The film forming apparatus 1 of this example is configured to form a silicon oxide layer ($SiO_2$ layer) on a wafer W by causing a raw material gas containing silicon (Si) to react with an oxidizing gas. The series of processes are repeated a plurality of times to form a $SiO_2$ film. Hereinafter, a case where a BTBAS (bis-tert-butylaminosilane) gas is used as the raw material gas and an ozone ($O_3$) gas is used as the oxidizing gas will be described as an example.

Figure 1:
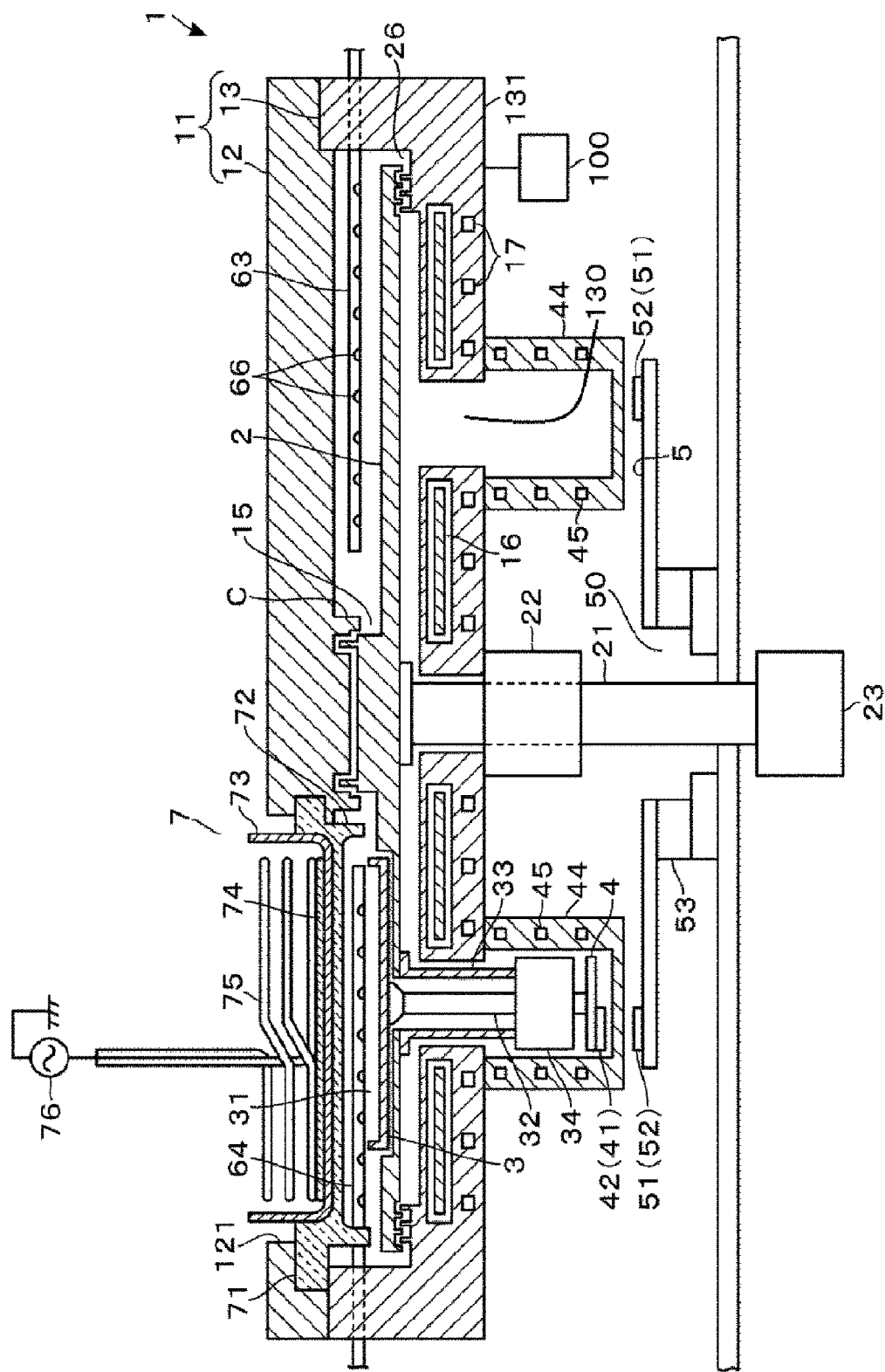
FIG. 1 is a vertical sectional side view showing one example of a film forming apparatus to which a substrate processing apparatus according to the present disclosure is applied.
Figure 2:
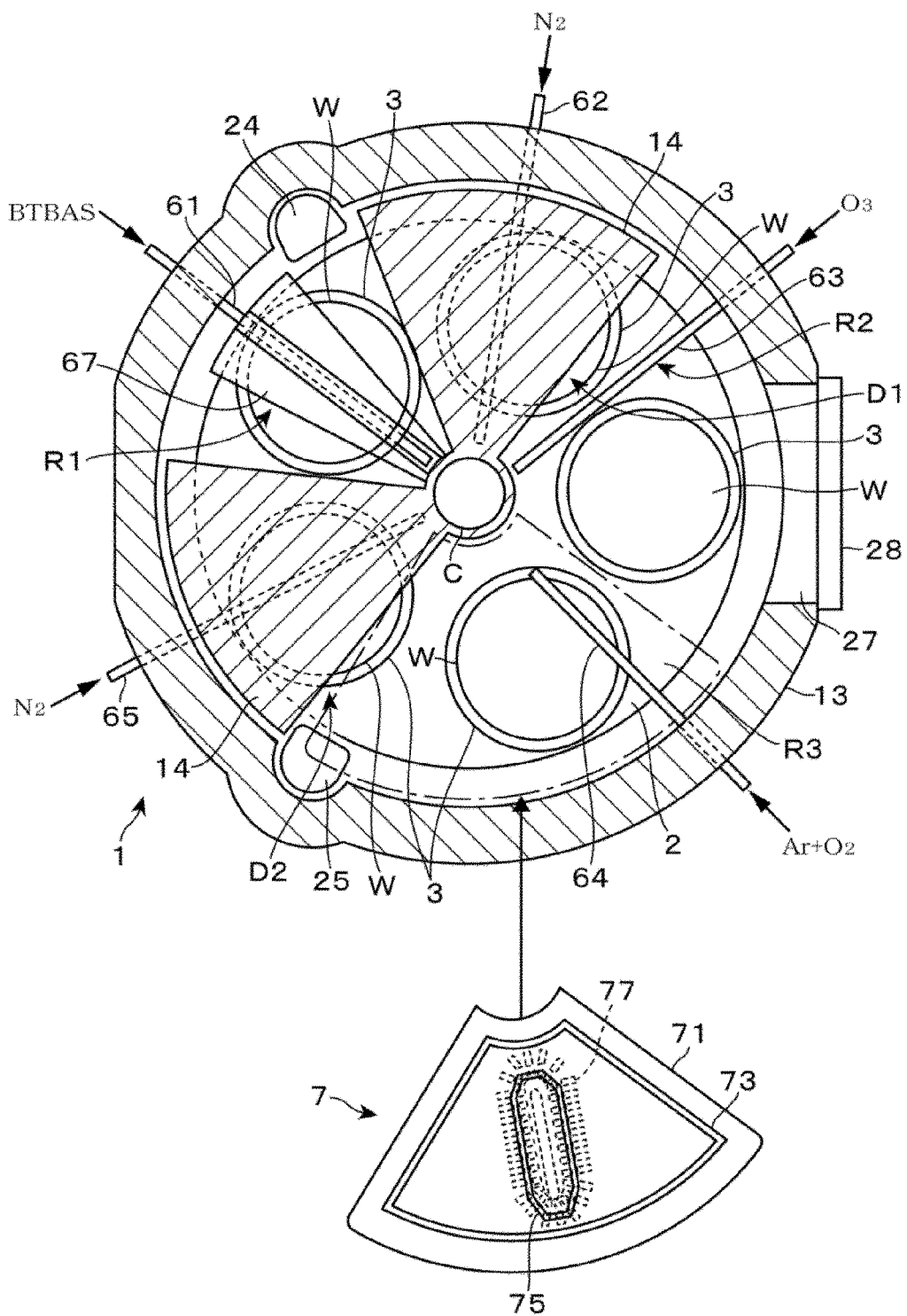
FIG. 2 is a horizontal sectional plan view of the film forming apparatus.

As shown in FIGS. 1 and 2, the film forming apparatus according to the present disclosure includes a vacuum container 11 constituting a processing container in which a film forming process is performed. The vacuum container 11 is configured as a flat container having a substantially circular plan-view shape by a container body 13 that defines a side wall and a bottom portion of the vacuum container 11 and a top plate 12 that airtightly closes an upper surface side opening of the container body 13. A rotary table 2 formed of a disc is provided in the vacuum container 11. A rotary shaft 21 extending vertically downward is connected to a central portion of the rotary table 2. The rotary shaft 21 passes through a bearing portion 22 provided in the bottom portion 131 of the container body 13 in order to keep the interior of the vacuum container 11 airtight against the external atmosphere. The rotary shaft 21 is connected to a revolution-purpose rotating mechanism 23 arranged on the lower side of the container body 13. By rotating the rotary shaft 21 using the revolution-purpose rotating mechanism 23, it is possible to rotate the rotary table 2, for example, in a clockwise direction when viewed from the upper surface side.

Figure 3:
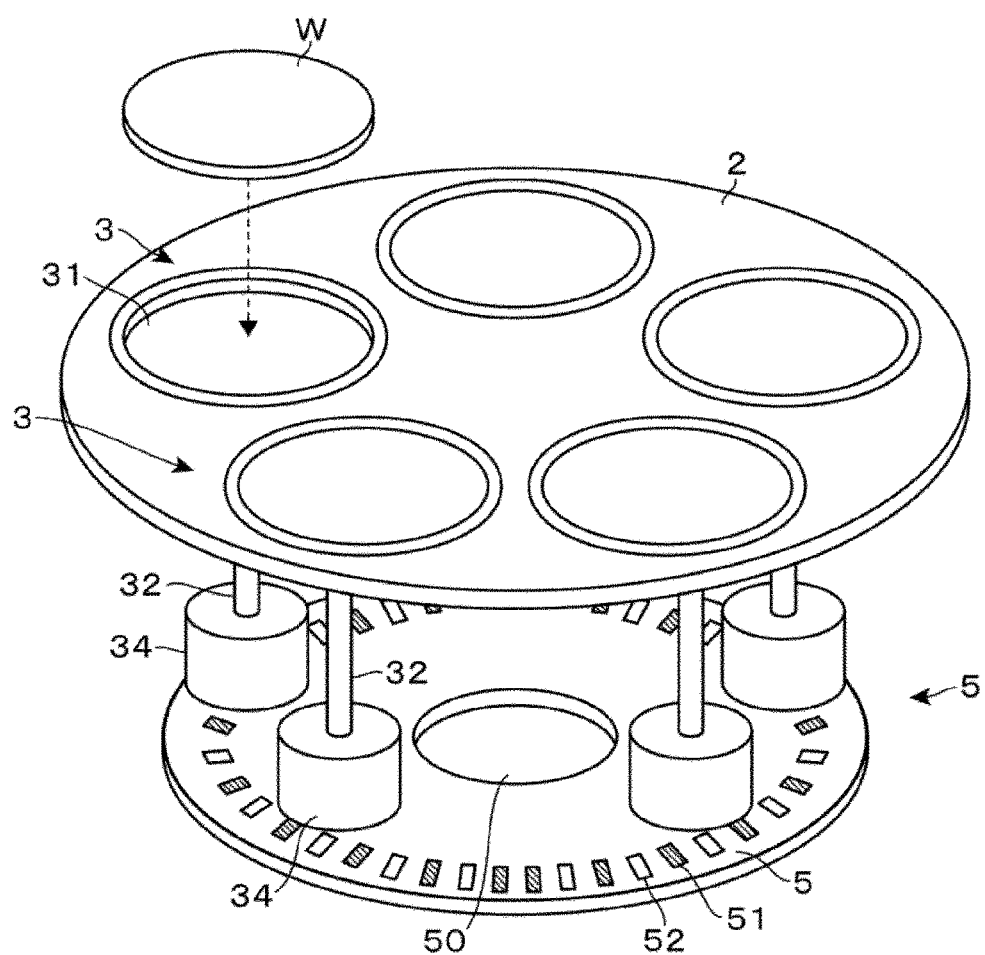
FIG. 3 is a schematic perspective view of a rotary table provided in the film forming apparatus.

Subsequently, the structure of the rotary table 2 will be described with additional reference to FIG. 3. FIG. 3 schematically shows a main part of the rotary table 2. On the upper surface side (one surface side) of the rotary table 2, there are provided mounting stands 3 revolved by the rotation of the rotary table 2. The mounting stands 3 are formed in a circular plan-view shape. For example, five mounting stands 3 are provided along the rotation direction of the rotary table 2. A recess 31 is formed on the upper surface of the mounting stand 3. A wafer W is horizontally accommodated in the recess 31. Alternatively, six mounting stands 3 may be provided in the rotary table 2.

In the central portion on the lower surface side of each mounting stand 3, a rotation shaft 32 supporting the mounting stand 3 is provided so as to extend vertically downward. The rotation shaft 32 is supported by, for example, a bearing unit 34 fixed to the lower surface of the rotary table 2 via a cylindrical body 33. The rotation shaft 32 and the cylindrical body 33 extend through each annular hole portion 130 formed along the circumferential direction in the bottom portion 131 of the container body 13. As shown in FIG. 1, the bearing unit 34 is provided on the lower side of the bottom portion 131 of the container body 13. Therefore, the rotation shaft 32 is rotatably provided at a portion which rotates together with the rotary table 2. The mounting stand 3 is configured so that it can be revolved by the rotation of the rotary table 2. The bearing unit 34 includes a bearing (not shown) for rotatably holding the rotation shaft 32 and a magnetic seal (not shown) for preventing scattering of particles from the bearing. The lower side of the rotation shaft 32 penetrates the bearing unit 34. A driven gear 4 is provided at the lower end portion of the rotation shaft 32.

Figure 4:
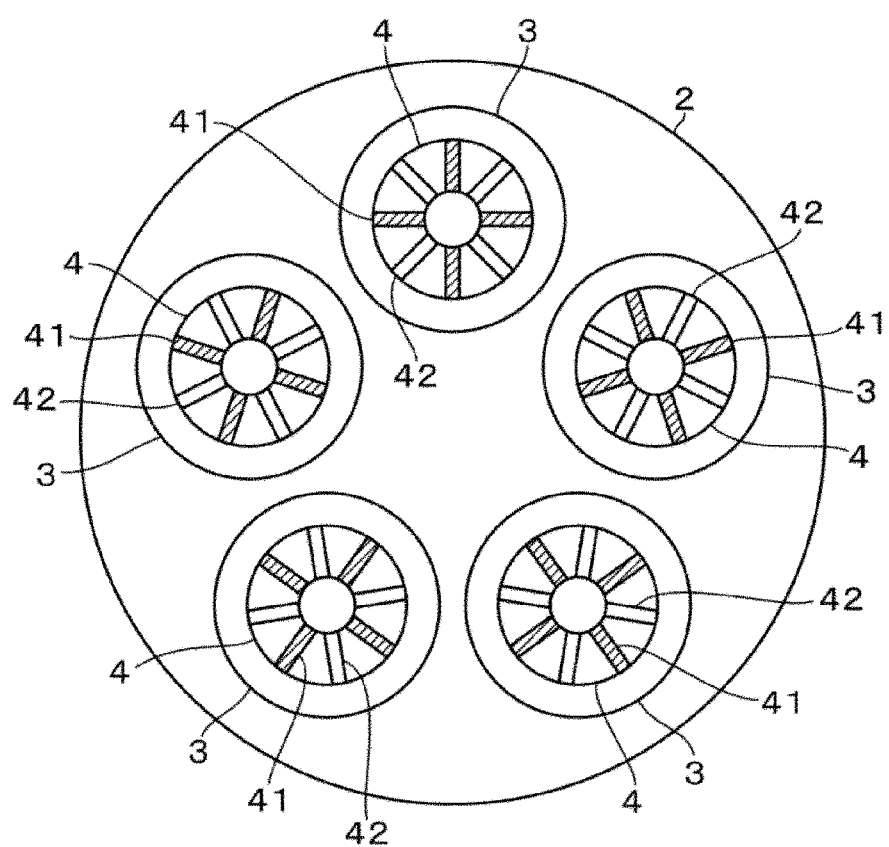
FIG. 4 is a bottom view schematically showing driven gears provided on the lower surfaces of mounting stands.

FIG. 4 is a view showing driven gears 4 viewed from the lower surface side. In FIG. 4, the driven gears 4 are schematically shown. Each of the driven gears 4 is formed in a disk shape and is connected to the rotation shaft 32 in a state in which the central axes thereof are aligned with each other. Therefore, the driven gear 4 is connected to the mounting stand 3 via the rotation shaft 32. The driven gear 4 is revolved by the rotation of the rotary table 2. Since the bearing unit 34 rotatably holds the rotation shaft 32, when the driven gear 4 is rotated in the circumferential direction, each mounting stand 3 can be rotated about its rotation axis.

On the lower surface of the driven gear 4, N pole portions 41 and S pole portions 42, which are magnetic pole portions made of permanent magnets, are alternately arranged along the rotation direction. The N pole portions 41 are indicated by hatching so as to distinguish them from the S pole portions 42. In this example, the N pole portions 41 and the S pole portions 42 exposed on the lower surface of the driven gear 4 are formed in the same rectangular shape, and, for example, 18 magnetic pole portions are arranged at intervals in the circumferential direction so as to radially extend in the lateral direction from the central portion of the lower surface of the driven gear 4. For example, the length of the N pole portions 41 and the S pole portions 42 is set shorter than the radius of the driven gear 4 so as not to exceed the center of the bottom surface of the driven gear 4.

As shown in FIGS. 1 and 3, a driving gear 5 is disposed on the lower side of the driven gears 4 on the outer side of the vacuum container 11 (air atmosphere side). In FIG. 3, the driven gears 4 and the driving gear 5 are depicted close to each other, and a partition member 44, which will be described later, is not shown. The driving gear 5, which constitutes a magnetic gear mechanism with the driven gears 4, is provided so as to face the revolution trajectory of the driven gears 4. The driving gear 5 of this example is an annular plate-like member having a circular opening 50 in the central portion thereof. The center of the opening 50 of the driving gear 5 is disposed so as to be aligned with the rotation center of the rotary table 2. N pole portions 51 and S pole portions 52, which are magnetic pole portions made of permanent magnets, are alternately arranged on the upper surface of the driving gear 5 along the revolution trajectory of the driven gears 4 over the entire circumference.

Figure 5:
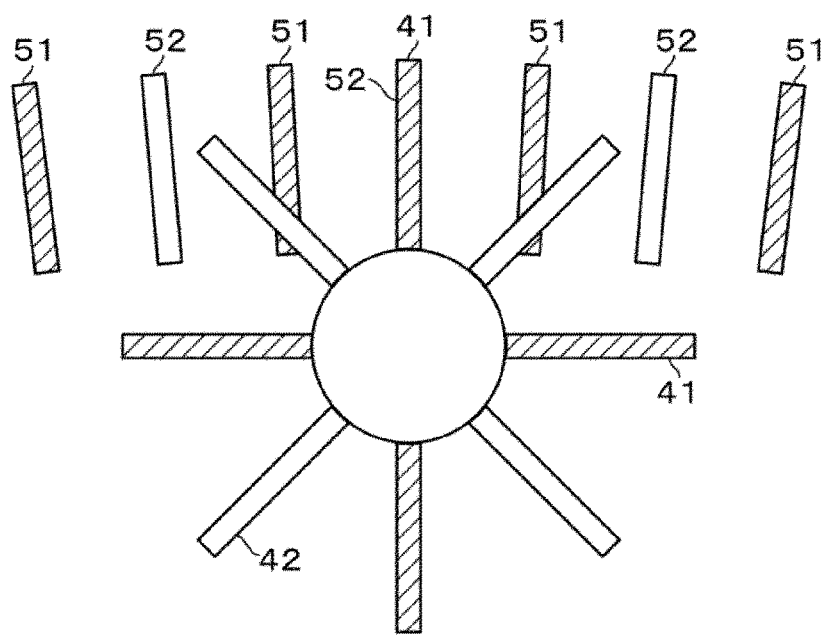
FIG. 5 is a plan view showing one of the driven gears and a part of a driving gear.

The N pole portions 51 and the S pole portions 52, which are the respective magnetic pole portions of the driving gear 5, are arranged on the surface opposed to the lower surfaces of the driven gears 4. In FIG. 5, the magnetic pole portions (the N pole portions 41 and the S pole portions 42) of one of the driven gears 4 are depicted in a corresponding relationship with the magnetic pole portions (the N pole portions 51 and the S pole portions 52) of the driving gear 5 on the lower side thereof. As described above, for example, the N pole portions 51 and the S pole portions 52 exposed on the surface of the annular driving gear 5 are formed in, for example, a rectangular shape so as to overlap with the shape of the N pole portions 41 and the S pole portions 42 formed on the lower surfaces of the driven gears 4 located opposite the surface of the driving gear 5.

Figure 6:
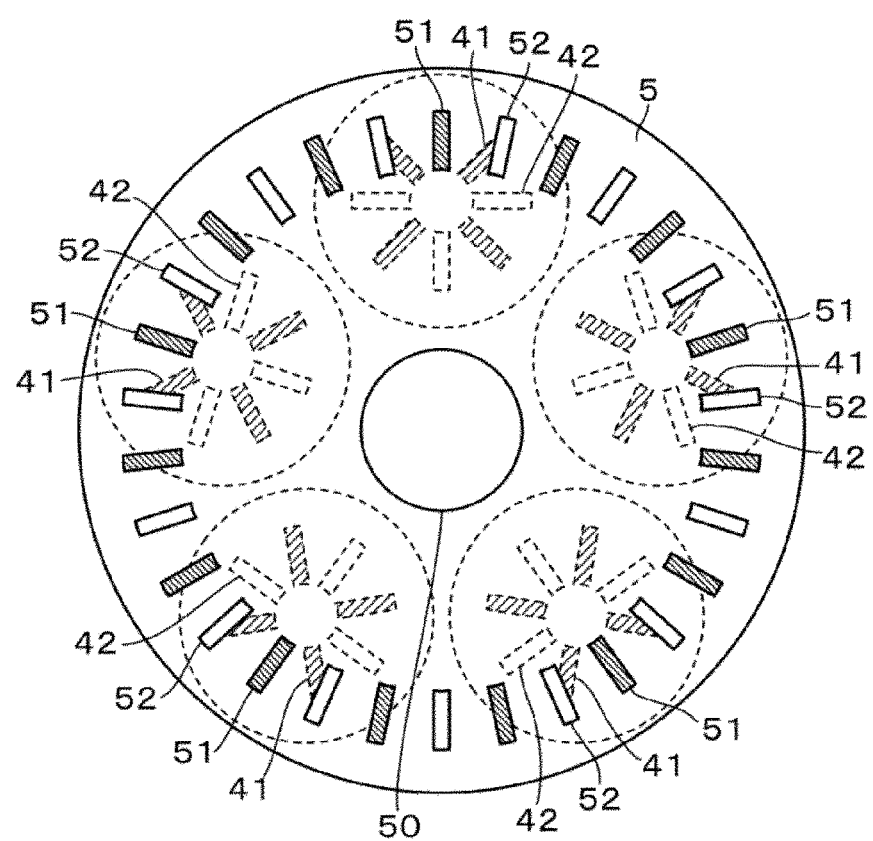
FIG. 6 is a plan view schematically showing the driven gears and the driving gear.

FIG. 5 shows a state in which the N pole portion 41 of the driven gear 4 and the S pole portion 52 of the driving gear 5 overlap with each other. FIG. 6 shows the arrangement of the N pole portions 51 and the S pole portions 52 of the driving gear 5. FIGS. 5 and 6 do not show the number of magnetic pole portions which is assumed when configured as an actual machine but show the number of magnetic pole portions for the sake of understanding of the technology. For example, in an actual example of the driving gear 5, the number of N pole portions 51 and S pole portions 52 is about 300 in total.

On the lower surface of the driving gear 5, there is provided a rotation-purpose rotating mechanism 53 formed of, for example, an annular direct drive motor (DD motor) for rotating the driving gear 5. By rotating the rotation-purpose rotating mechanism 53, the driving gear 5 is rotated about the center of the opening 50 as a rotation center. Therefore, the driving gear 5 and the rotary table 2 rotate about the same rotation axis. In this example, the rotary shaft 21 of the rotary table 2 is provided so as to penetrate the opening 50 of the driving gear 5 and is connected to the revolution-purpose rotating mechanism 23 provided on the lower side of the driving gear 5. However, the present disclosure is not limited to the above-described configuration as long as the rotary table 2 and the driving gear 5 are configured to rotate with their rotation centers aligned with each other.

The driven gears 4 are provided in a vacuum atmosphere. A partition member 44 configured to partition the air atmosphere and the vacuum atmosphere and made of a material that passes magnetic force lines, for example, aluminum (Al), is provided between the driven gears 4 and the driving gear 5. The partition member 44 forms a moving region of the bearing unit 34 when the respective mounting stands 3 are revolved. For example, the upper end portion of the partition member 44 is fixed to the bottom portion 131 of the vacuum container 11. A coolant flow path 45 through which a coolant flows is provided in the side wall of the partition member 44. The partition member 44 is, for example, a member having a U-shaped cross section with an open upper surface and is provided in the bottom portion 131 of the container body 13 along the circumferential direction so as to close the hole portion 130 from the lower side. In this way, the moving region of the rotation shaft 32 and the bearing unit 34 is formed by the hole portion 130 and the partition member 44.

Next, the revolution and rotation of the mounting stands 3 will be described. FIG. 6 schematically shows a state in which the five driven gears 4 are stopped to partially face the driving gear 5 in a state in which the rotary table 2 and the driving gear 5 are stopped (in a state in which the rotary table 2 and the driving gear 5 are not rotating). The driven gears 4 are stopped at the position determined by the overall action of an attraction force and a repulsion force between the respective magnetic pole portions (the N pole portions 41 and the S pole portions 42) of the driven gears 4 and the magnetic pole portions (the N pole portions 51 and the S pole portions 52) of the driving gear 5. Therefore, when the rotary table 2 and the driving gear 5 are rotated at the same revolution number (rotation speed: rpm), the driven gears 4 are stopped relative to the driving gear 5. Thus, the driven gears 4, namely the mounting stands 3, do not rotate on their own axes but are stopped.

Figure 7:
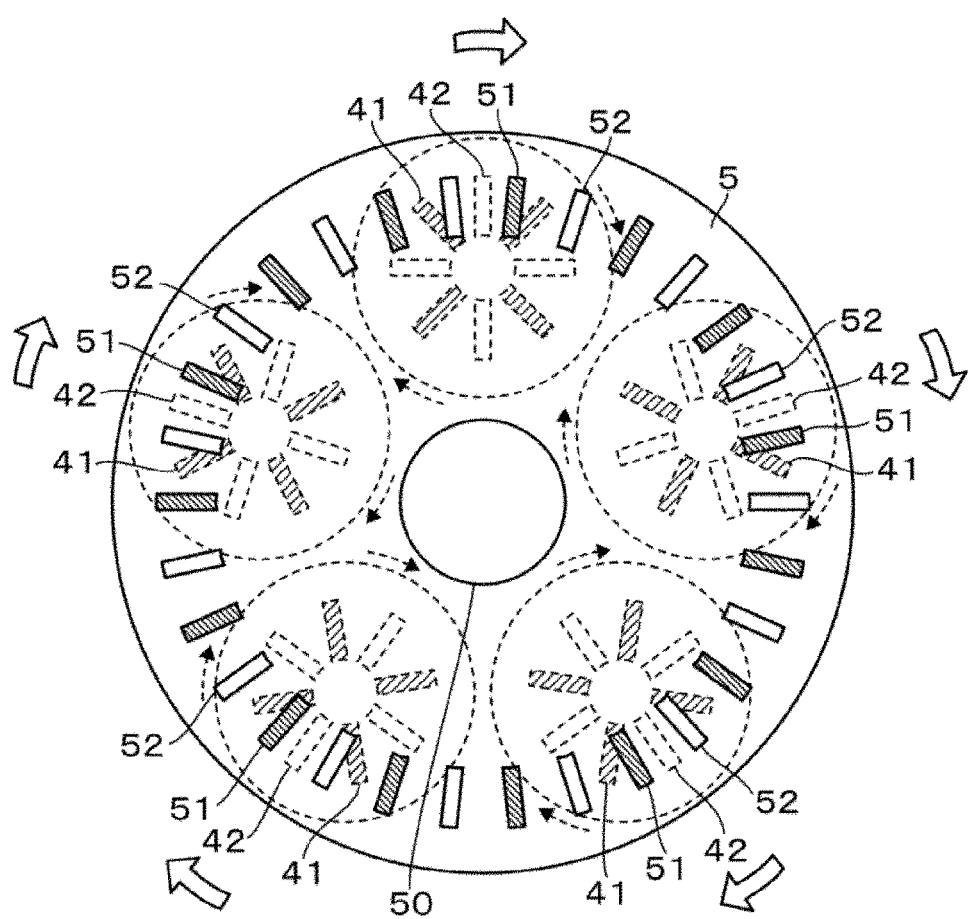
FIG. 7 is a plan view schematically showing the driven gears and the driving gear.

The mounting stands 3 are rotated on their own axes when a difference in the revolution number is generated between the driving gear 5 and the rotary table 2, namely when a velocity difference is generated between the angular velocity of the driving gear 5 and the angular velocity (so-called revolution angular velocity) of the driven gears 4 due to the rotation of the rotary table 2. When the angular velocity Va of the driving gear 5 is larger than the angular velocity Vb of the driven gear 4 (when the velocity difference obtained by subtracting the angular velocity of the driven gear 4 from the angular velocity of the driving gear 5 is positive), the arrangement of the N pole portions 51 and the S pole portions 52 of the driving gear 5 moves from the left side to the right side in FIG. 5 under the arrangement of the N pole portions 41 and the S pole portions 42 of the driven gear 4 facing the driving gear 5. Therefore, the repulsion force and the attraction force from the driving gear 5 acting on the driven gear 4 move to the right side. Along with this, the arrangement of the N pole portions 41 and the S pole portions 42 of the driven gear 4 is also brought to the right side. As a result, the driven gear 4 rotates to the right side, namely in the clockwise direction from the state shown in FIG. 6 to the state shown in FIG. 7.

When the angular velocity Va of the driving gear 5 is smaller than the angular velocity Vb of the driven gear 4 (when the velocity difference obtained by subtracting the angular velocity of the driven gear 4 from the angular velocity of the driving gear 5 is negative), the arrangement of the N pole portions 51 and the S pole portions 52 of the driving gear 5 moves from the right side to the left side in FIG. 5 under the arrangement of the N pole portions 41 and the S pole portions 42 of the driven gear 4 facing the driving gear 5. Therefore, the repulsion force and the attraction force from the driving gear 5 acting on the driven gear 4 move to the left side. Along with this, the arrangement of the N pole portions 41 and the S pole portions 42 of the driven gear 4 is also brought to the left side. As a result, the driven gear 4 rotates to the left side in FIG. 5, namely in the counterclockwise direction.

Figure 8:
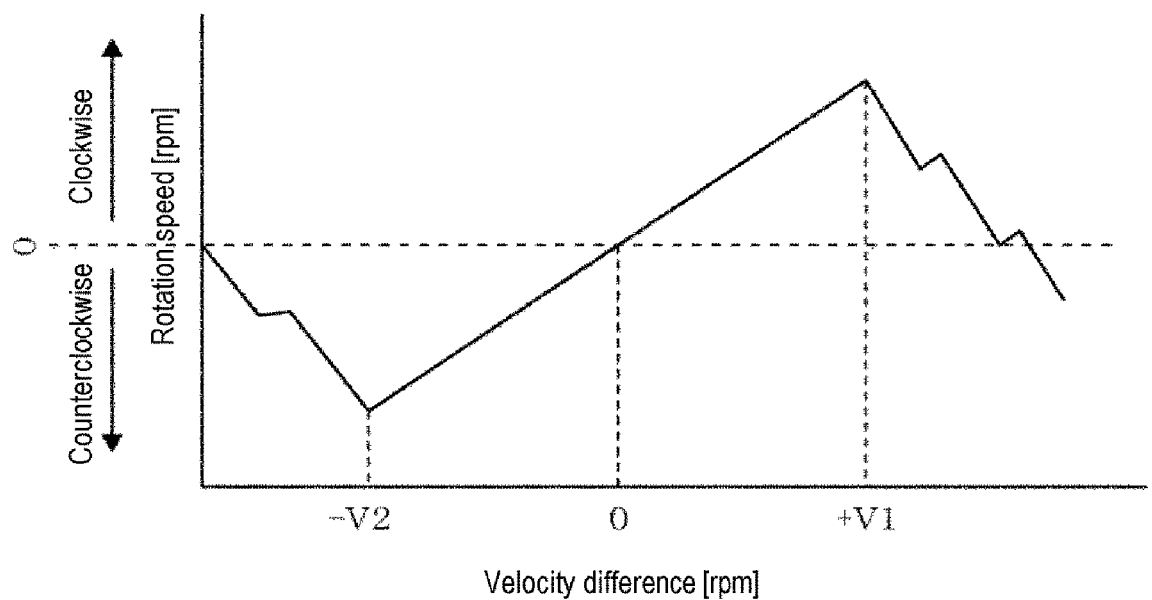
FIG. 8 is a characteristic diagram showing a relationship between the velocity difference between an angular velocity of the driven gears and an angular velocity of the driving gear and the rotation speed of the driven gears.

The present inventors found that as shown in FIG. 8, the velocity difference between the angular velocity of the driven gear 4 due to the revolution and the angular velocity of the driving gear 5 and the rotation speed of the driven gear 4 are maintained in a substantially proportional relationship in a range where a velocity difference exists. In FIG. 8, the horizontal axis represents the velocity difference (Va−Vb) between the angular velocity Va of the driving gear 5 and the angular velocity Vb of the driven gear 4 due to the revolution, and the vertical axis represents the rotation speed of the driven gear 4. When the velocity difference is positive ((Va−Vb)>0), the clockwise rotation speed increases as the velocity difference increases from 0 to +V1. When the velocity difference is negative ((Va−Vb)<0), the counterclockwise rotation speed increases as the velocity difference increases from 0 to −V2. For example, the angular velocity of the driving gear 5 is set up to a value at which the velocity difference and the rotation speed of the driven gear 4 are maintained in a substantially proportional relationship.

As described above, the mounting stand 3 rotates on its own axis when there is a difference in the revolution number between the driving gear 5 and the rotary table 2. The rotation speed at this time is obtained by multiplying the gear ratio of the driving gear 5 and the driven gear 4 by the rotation speed difference. The rotation speed difference refers to the velocity difference between the angular velocity of the driving gear 5 and the angular velocity of the driven gear 4 (so-called revolution angular velocity) due to the rotation of the rotary table 2. In a model in which the driving gear 5 is made up of 300 magnetic pole portions (N pole portions 51 and S pole portions 52) and the driven gear 4 is made up of 18 magnetic pole portions (N pole portions 41 and S pole portions 42), for example, when the revolution number of the rotary table 2 is 30 rpm, the rotation speed in the case of going the driving gear 5 ahead by 0.1 degree/second (6 degrees/minute) is obtained as follows. The gear ratio is 300/18 =16.67 and the rotation speed difference is 6/360 rpm. Therefore, the rotation speed of the driven gear 4 is obtained by the gear ratio by the rotation speed difference, i.e., 300/18×6/360=0.278 rpm (100 degrees/min). The rotation speed obtained in this way coincides with the data on the rotation speed obtained in the evaluation test described later.

The relationship between the velocity difference between the angular velocity Vb of the driven gear 4 and the angular velocity Va of the driving gear 5 and the rotation speed of the driven gear 4 varies depending on the magnetic force magnitude, shape and arrangement of the N pole portions 41 and 51 and the S pole portions 42 and 52 constituting the driven gear 4 and the driving gear 5, the distance between the driven gear 4 and the driving gear 5, the film forming process conditions, and the like. Therefore, for example, the relationship between the velocity difference between the angular velocity Vb of the driven gear 4 due to the revolution and the angular velocity Va of the driving gear 5 and the rotation speed of the driven gear 4 is acquired in advance.

Subsequently, referring back to FIGS. 1 and 2, the structure of the vacuum container 11 will be described. In the central portion of the lower surface of the top plate 12 constituting the vacuum container 11, a central region forming portion C having a circular plan-view shape and protruding portions 14 having a fan-like plan-view shape are formed to extend from the central region forming portion C toward the outside of the rotary table 2. In the internal space of the vacuum container 11, the central region forming portion C and the protruding portions 14 form a ceiling surface which is lower than the outer region thereof. The gap between the central region forming portion C and the central portion of the rotary table 2 constitutes a flow path 15 of an $N_2$ gas. By discharging the $N_2$ gas from the flow path 15 during the processing of the wafer W, it is possible to suppress the contact between the raw material gas and the oxidizing gas in the central portion of the rotary table 2.

As shown in FIG. 1, a heater 16 is disposed in the bottom portion 131 of the container body 13 positioned below the rotary table 2, and a coolant flow path 17 for allowing a coolant to flow therethrough is formed. As shown in FIG. 2, for example, on the outer side of the rotary table 2 in the bottom portion 131, exhaust ports 24 and 25 for evacuating the interior of the vacuum container 11 are opened. A vacuum exhaust mechanism (not shown) configured by a vacuum pump or the like is connected to the exhaust ports 24 and 25.

Between the peripheral side region of the lower surface of the rotary table 2 and the peripheral side region of the bottom portion 131 of the container body 13, there is provided a labyrinth seal portion 26 made up of a plurality of annular ridges and grooves formed on the lower surface of the rotary table 2 and a plurality of annular ridges and grooves formed in the bottom portion 131. The labyrinth seal portion 26 restrains various kinds of gases supplied to the upper surface side of the rotary table 2 from entering the space on the lower surface side of the rotary table 2. Even when particles are generated in the bearing portion 22, the bearing unit 34 and the like, the labyrinth seal portion 26 prevents the particles from entering the space on the upper surface side of the rotary table 2.

As shown in FIG. 2, on the side wall surface of the vacuum container 11 (the container body 13), there is provided a loading/unloading port 27 configured to be opened and closed by a gate valve 28. The wafer W held by an external transfer mechanism (not shown) is loaded into the vacuum container 11 via the loading/unloading port 27 and is delivered to the mounting stand 3. The delivery of the wafer W between the mounting stand 3 and the transfer mechanism is performed by using lift pins configured to be able to move up and down via through-holes (not shown) provided in each mounting stand 3. Description of the lift pins is omitted.

As shown in FIGS. 1 and 2, on the upper side of the rotary table 2 in the film forming apparatus 1, a raw material gas nozzle 61, a separation gas nozzle 62, an oxidizing gas nozzle 63, a modifying gas nozzle 64 and a separation gas nozzle 65 are arranged in the named order at intervals in the rotation direction of the rotary table 2. Each of the gas nozzles 61 to 65 is formed in a rod shape extending horizontally along the radial direction of the rotary table 2 from the side wall of the vacuum container 11 toward the central portion. Various gases are discharged downward from a large number of discharge holes 66 provided at intervals along the length direction of each of the gas nozzles 61 to 65.

The raw material gas nozzle 61 discharges a BTBAS gas. Reference numeral 67 in FIG. 2 denotes a nozzle cover that covers the raw material gas nozzle 61. The nozzle cover 67 serves to increase the concentration of the BTBAS gas on the lower side thereof. The oxidizing gas nozzle 63 discharges an $O_3$ gas. The separation gas nozzles 62 and 65 are configured to discharge an $N_2$ gas and are disposed at such positions as to divide the respective protruding portions 14 of the top plate 12 in the circumferential direction when viewed from the upper surface side. The modifying gas nozzle 64 discharges a modifying gas composed of, for example, a mixed gas of an argon (Ar) gas and an oxygen ($O_2$) gas. In this example, each of the raw material gas, the oxidizing gas and the modifying gas corresponds to a processing gas. Each of the raw material gas nozzle 61, the oxidizing gas nozzle 63 and the modifying gas nozzle 64 corresponds to a processing gas supply part for supplying the processing gas.

In the top plate 12, a plasma forming portion 7 is provided above the modifying gas nozzle 64. In FIG. 2, the position where the plasma forming portion 7 is provided is indicated by a one-dot chain line. Reference numeral 71 in FIG. 2 denotes a main body portion made of a dielectric material such as quartz or the like. A protrusion 72 which protrudes downward along the fan-like opening 121 provided in the top plate 12 is provided on the lower surface of the main body portion 71. The modifying gas is discharged from the modifying gas nozzle 64 into the region surrounded by the protrusion 72.

An antenna 75 formed by winding a metal wire in a coil shape is provided on the upper surface side of the main body portion 71 via a Faraday shield 73 and an insulating plate member 74. A high frequency power source 76 is connected to the antenna 75. Reference numeral 77 in FIG. 2 denotes slits for directing a magnetic field component of an electromagnetic field downward.

On the rotary table 2, the lower region of the raw material gas nozzle 61 corresponds to an adsorption region R1 where the BTBAS gas is adsorbed, and the lower region of the oxidizing gas nozzle 63 corresponds to an oxidizing region R2 where the BTBAS gas is oxidized. Furthermore, the lower region of the plasma forming portion 7 constitutes a modifying region R3 in which the $SiO_2$ film is modified by the plasma. The lower regions of the protruding portions 14 constitute separation regions D1 and D2 for separating the adsorption region R1 and the oxidizing region R2 from each other using the $N_2$ gas discharged from the separation gas nozzles 62 and 65.

The aforementioned exhaust port 24 is opened to the outside between the adsorption region R1 and the separation region D1 adjacent to the adsorption region R1 on the downstream side in the rotation direction of the adsorption region R1 and is configured to exhaust an excess BTBAS gas. The exhaust port 25 is opened to the outside in the vicinity of the boundary between the modifying region R3 and the separation region D2 adjacent to the modifying region R3 on the downstream side in the rotation direction of the modifying region R3 and is configured to exhaust an excess $O_3$ gas and an excess modifying gas. The $N_2$ gas supplied from the respective separation regions D1 and D2 and the central region C is also exhausted from the exhaust ports 24 and 25.

Figure 9:
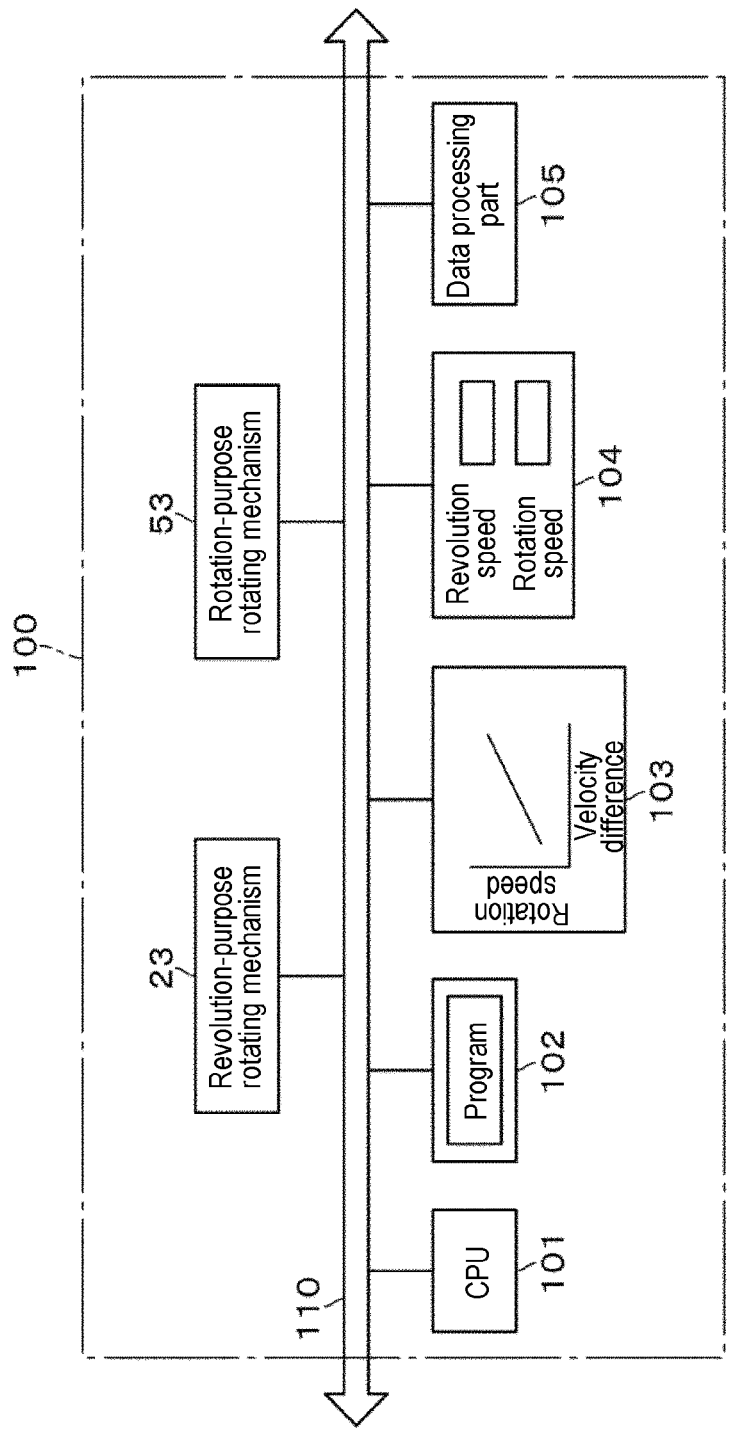
FIG. 9 is a configuration diagram showing an example of a control part provided in the film forming apparatus.

As shown in FIG. 9, the film forming apparatus 1 is provided with a control part 100 formed of a computer for controlling the overall operation of the apparatus. The control part 100 includes a CPU 101, a program storage part 102 that stores a program for executing an operation relating to a film forming process described later, a memory part 103, an input part 104, and a data processing part 105, which are connected to one another via a bus 101. Reference numeral 110 in FIG. 9 denotes a bus to which the revolution-purpose rotating mechanism 23 for the rotary table 2 and the rotation-purpose rotating mechanism 53 for the mounting stand 3 are connected.

The memory part 103 is configured to store the relationship between the rotation speed of the driven gear 4 and the velocity difference between the angular velocity of the driven gear 4 due to the revolution and the angular velocity of the driving gear 5 shown in FIG. 8, for example. The input part 104 is formed of, for example, an operation screen, and is used for inputting the rotation speed of the driven gear 4 and the angular velocity of the driven gear 4 due to the revolution (the revolution number of the rotary table 2). In FIG. 9, the angular velocity due to the revolution is defined as a revolution speed. The data processing part 105 is configured to set the revolution number of the driving gear 5 based on the input rotation speed of the driven gear 4, the revolution number of the rotary table 2 and the relationship stored in the memory part 103. The rotation speed of the driven gear 4 and the angular velocity of the driven gears 4 due to the revolution may be inputted, for example, during maintenance. If the rotation speed and the angular velocity of the driven gear 4 are inputted, the velocity difference between the angular velocity of the driven gear 4 due to the revolution and the angular velocity of the driving gear 5 is grasped from the aforementioned relationship on the basis of the inputted rotation speed. Then, the revolution number of the driving gear 5 is set.

The program described above transmits a control signal to each part of the film forming apparatus 1 to control the operation of each part. For example, the rotation speed of the mounting stand 3 is written, for example, in the recipe of the film forming process. By selecting the recipe, the supply flow rate of each processing gas or the like from each of the gas nozzles 61 to 65, the heating temperature of the wafer W heated by the heater 16, the supply flow rate of the $N_2$ gas from the central region forming portion C, the rotation of the rotary table 2 by the revolution-purpose rotating mechanism 23, the rotation of the mounting stand 3 by the magnetic gear mechanism, and the like are controlled according to the control signal. In the aforementioned program, a group of steps for performing these controls and executing each process to be described later is incorporated. The program is installed in the control part 100 from a storage medium such as a hard disk, a compact disk, a magneto-optical disk, a memory card, a flexible disk or the like.

Hereinafter, the operation of the film forming apparatus 1 having the above-described configuration will be described. First, while intermittently rotating the rotary table 2, each mounting stand 3 is moved to a position facing the loading/unloading port 27. A wafer W is loaded from the outside into the vacuum container 11 by using a transfer mechanism (not shown) and is delivered to the mounting stand 3. After the wafers W are mounted on all the mounting stands 3, the transfer mechanism is withdrawn from the vacuum container 11. The gate valve 28 is closed and the interior of the vacuum container 11 is evacuated to a predetermined pressure via the exhaust ports 24 and 25. An $N_2$ gas is supplied to the rotary table 2 from the separation gas nozzles 62 and 65 and the central region forming portion C. The heating of the wafer W by the heater 16 is started to heat the wafer W to a temperature of, for example, 200 degrees C. or lower.

For example, the rotary shaft 21 is driven by the revolution-purpose rotating mechanism 23 to rotate the rotary table 2 at a rotation speed of 80 rpm or more, for example, 120 rpm. The driving gear 5 is rotated at the same speed as the rotary table 2 by the rotation-purpose rotating mechanism 53. As a result, the mounting stand 3 revolves while stopping the rotation on its own axis. Next, in the vacuum container 11, the supply of the respective processing gases from the raw material gas nozzle 61, the oxidizing gas nozzle 63 and the modifying gas nozzle 64 and the formation of plasma by the application of a high frequency to the antenna 75 from the high frequency power source 76 are started. In addition, for example, in conformity with the supply of the respective processing gases, the driving gear 5 is rotated by the rotation-purpose rotating mechanism 53, whereby the mounting stand 3 is rotated on its own axis at a predetermined rotation speed.

As shown in FIG. 2, in the vacuum container 11, the separation region D1 to which the $N_2$ gas is supplied is provided between the adsorption region R1 and the oxidizing region R2. Therefore, the raw material gas supplied to the adsorption region R1 and the oxidizing gas supplied to the oxidizing region R2 are exhausted without being mixed with each other on the rotary table 2. Furthermore, the separation region D2 to which the $N_2$ gas is supplied is also provided between the adsorption region R1 and the modifying region R3. Therefore, the raw material gas, the modifying gas supplied to the modifying region and the oxidizing gas flowing from the upstream side in the rotation direction of the modifying region R3 to the separation region D2 are not mixed with each other on the rotary table 2 and are exhausted from the exhaust ports 24 and 25. The $N_2$ gas supplied from the central region forming portion C is also exhausted from the exhaust ports 24 and 25.

As described above, each wafer W sequentially passes through the adsorption region R1, the oxidizing region R2 and the modifying region R3 in a state in which the supply and exhaust of the respective gases are performed as described above. In the adsorption region R1, the BTBAS gas discharged from the raw material gas nozzle 61 is adsorbed onto the wafer W. In the oxidizing region R2, the adsorbed BTBAS gas is oxidized by the $O_3$ gas supplied from the oxidizing gas nozzle 63, whereby one or more molecular layers of $SiO_2$ are formed. In the modifying region R3, the molecular layers of $SiO_2$ are modified by being exposed to the plasma of the modifying gas. By the rotation of the rotary table 2, the above-described cycles are repeatedly executed a plurality of times, whereby the molecular layers of $SiO_2$ are stacked one above another and an $SiO_2$ film is formed on the surface of the wafer W.

In the film forming apparatus 1, in parallel to the rotation of the rotary table 2, the wafer W is rotated by rotation of the mounting stand 3. The revolution number of the rotary table 2 and the rotation speed of the mounting stand 3 are set so as not to synchronize the rotation of the rotary table 2 and the rotation of the mounting stand 3. That is, the revolution number of the rotary table 2 and the rotation speed of the mounting stand 3 are set so that when the wafer W is rotated on its own axis at such a rotation speed that the rotary table 2 makes one revolution from a start point in a state in which the wafer W is oriented in a first direction, and then the rotary table 2 is positioned at the start point again, the wafer W is oriented in a second direction different from the first direction.

As described above, the mounting stand 3 rotates while not synchronizing with the rotation of the rotary table 2. Therefore, the wafer W mounted on each mounting stand 3 passes through the adsorption region R1 of the raw material gas in various orientations due to the rotation and revolution thereof. In this way, the cycle of forming the above-mentioned molecular layer of $SiO_2$ is executed while gradually changing the orientation of the wafer W viewed from the upper surface side along with the rotation of the mounting stand 3. By performing the film formation while changing the orientation of the wafer W, for example, even if the concentration distribution of the raw material gas is varied in the adsorption region R1, the amount of the raw material gas adsorbed onto the wafer W can be made uniform in the circumferential direction of the wafer W when viewed in terms of the entire period of the formation cycle of the $SiO_2$ molecular layer executed a plurality of times. As a result, as seen in the circumferential direction of the wafer W, it is possible to limit variations in film thickness of the $SiO_2$ film formed on the wafer W.

By the above-described operation, the molecular layers of $SiO_2$ are sequentially stacked one above another. After a predetermined number of the cycles is executed, the rotation of the rotary table 2, the supply of various gases, the formation of plasma, and the operation of the revolution-purpose rotating mechanism 23 and the rotation-purpose rotating mechanism 53 are stopped to terminate the film forming process. Thereafter, the pressure in the vacuum container 11 is adjusted. The gate valve 28 is opened to allow the external transfer mechanism to enter the vacuum container 11. The wafer W is unloaded in the procedure opposite to the loading procedure.

As described above, in the film forming apparatus 1, the revolution and the rotation are performed in parallel with each other during the film formation on the wafer W. However, the rotation of the wafer W (mounting stand 3) includes not only a case where the wafer W is continuously rotated during the rotation of the rotary table 2 but also a case where the wafer W is intermittently rotated during the rotation of the rotary table 2. In addition, the timings of starting and stopping the rotation of the wafer W may be aligned with, or may deviate from, the timings of starting and stopping the revolution of the wafer W.

According to the film forming apparatus 1 of the present embodiment, the following effects may be achieved. In order to perform the film forming process on the wafer W while revolving the wafer W mounted on one surface side of the rotary table 2, the driven gear 4 is provided on the rotation shaft 32 of the mounting stand 3, and the driving gear 5 constituting the magnetic gear mechanism with the driven gear 4 is provided along the entire circumference of the revolution trajectory of the driven gear 4. Accordingly, by rotating the driving gear 5 and generating the velocity difference between the angular velocity of the driving gear 5 and the angular velocity of the driven gear 4 due to the revolution, the mounting stand 3 is rotated on its own axis. Thus, it is possible to improve the uniformity of the film forming process in the circumferential direction of the wafer W, whereby the in-plane uniformity of the film thickness can be improved. In addition, by using the non-contact type magnetic gear mechanism, it is possible to suppress generation of particles due to the above-described rotation operation. Furthermore, by adjusting the difference between the angular velocity of the driving gear 5 and the angular velocity of the driven gear 4, it is possible to easily adjust the rotation speed of the driven gear 4.

Furthermore, since the driving gear 5 is provided over the entire circumference of the revolution trajectory of the driven gear 4, it is possible to simultaneously drive the driven gears 4 of a plurality of mounting stands 3. Moreover, the driven gear 4 receives a driving force over the entire circumference of the revolution trajectory. Therefore, when adjusting the difference between the angular velocity of the driving gear 5 and the angular velocity of the driven gear 4 to control the rotation speed, even if the revolution number (revolution speed) of the rotary table 2 is large, for example, 80 rpm or more, it is possible to widen the control range. Accordingly, it is possible to improve the uniformity of processing in the circumferential direction of the wafer W while increasing the rotation speed of the rotary table 2 to enhance productivity.

Furthermore, since each of the driven gear 4 and the driving gear 5 has magnetic pole portions made of permanent magnets, it is easy to perform control for the rotation operation, and it is possible to lower production costs. Between the driven gear 4 and the driving gear 5, the partition member 44 made of a material through which a magnetic force line passes is provided so as to partition an air atmosphere and a vacuum atmosphere. The driving gear 5 is provided on the air atmosphere side. Therefore, even if particles are generated on the side of the driving gear 5, the entry of the particles into the vacuum container 11 is suppressed. This facilitates electrical control and maintenance. Moreover, since the driving gear 5 is provided in the air atmosphere and the driven gear 4 is disposed in a region spaced apart from the heater 16, it is possible to suppress a decrease in magnetic force due to high temperature.

Furthermore, if the angular velocity of the driving gear 5 is set up to a value at which the velocity difference between the angular velocity of the driven gear 4 due to the revolution and the angular velocity of the driving gear 5 and the rotation speed of the driven gear 4 are maintained in a substantially proportional relationship, it is possible to easily set the rotation speed of the driven gear 4. This facilitates the control. In addition, by providing the memory part 103, the input part 104 and the data processing part 105 in the control part 100, for example, when changing the rotation speed of the mounting stand 3, if the rotation speed of the driven gear 4 is inputted to the input part 104, it is possible to automatically set the revolution number of the driving gear 5. This facilitates the rewriting of a recipe and the maintenance.

Figure 10:
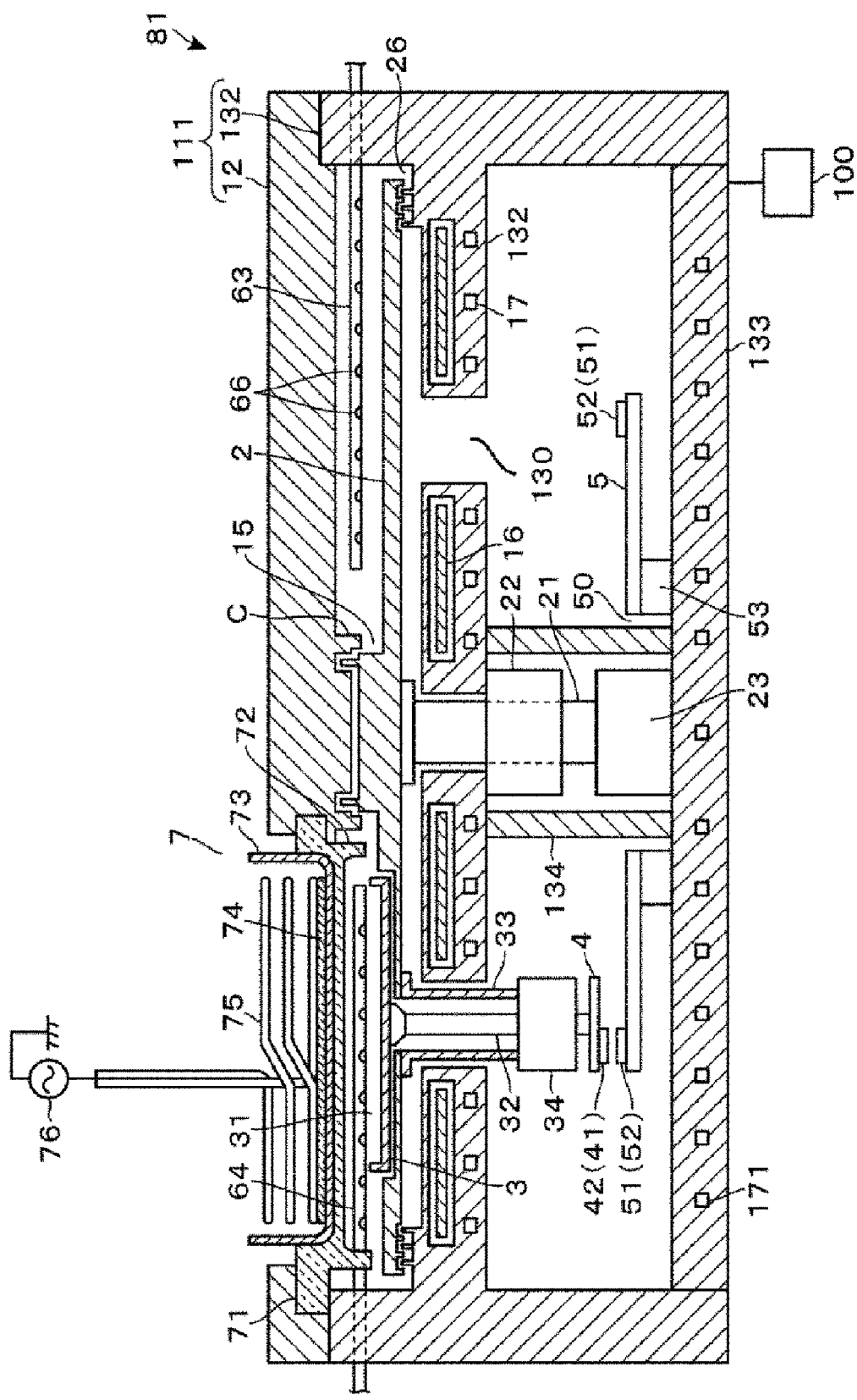
FIG. 10 is a vertical sectional side view showing another example of a film forming apparatus to which a substrate processing apparatus according to the present disclosure is applied.

Subsequently, another example of the film forming apparatus to which the substrate processing apparatus of the present disclosure is applied will be described with reference to FIG. 10. This film forming apparatus 81 is suitable for, for example, a case where a film forming process is performed at a film forming process temperature of 200 degrees C. or lower. The film forming apparatus 81 differs from the film forming apparatus 1 shown in FIG. 1 in that the revolution-purpose rotating mechanism 23 for the rotary table 2 and the rotation-purpose rotating mechanism 53 for the mounting stand 3 are provided inside the vacuum container (processing container) 111.

Therefore, in the vacuum container 111, a partition wall portion 132 for partitioning the installation area of the revolution-purpose rotating mechanism 23 and the rotation-purpose rotating mechanism 53 is provided so as to face a bottom portion 133. The partition wall portion 132 corresponds to the bottom portion 131 of the film forming apparatus 1 shown in FIG. 1. A heater 16 and a coolant flow path 17 are provided in the partition wall portion 132. Openings for the rotary shaft 21 and the rotation shaft 32 are formed in the partition wall portion 132. The rotary shaft 21 of the rotary table 2 is connected to the revolution-purpose rotating mechanism 23 via a bearing portion 22 provided in the partition wall portion 132. The peripheries of the bearing portion 22 and the revolution-purpose rotating mechanism 23 are surrounded by, for example, a cylindrical body 134. The cylindrical body 134 is provided inside the opening 50 of the driving gear 5. A coolant flow path 171 is provided in a bottom portion 133 of the vacuum container 111. An annular hole portion 130 for forming a moving region of the rotation shaft 32 is formed in the partition wall portion 132.

The bearing unit 34 to which the rotation shaft 32 of the mounting stand 3 is connected is connected to the rotary table 2 via the cylindrical body 33. The rotation shaft 32 is connected to the driven gear 4. The driving gear 5 is provided to face the driven gear 4. Other configurations are the same as those of the film forming apparatus 1 shown in FIG. 1. The same constituent members are denoted by the same reference numerals and the description thereof is omitted. Even in this film forming apparatus 81, by rotating the driving gear 5, the mounting stand 3 is rotated on its own axis. It is therefore possible to improve the uniformity of the film forming process in the circumferential direction of the wafer W.

In the above example, the bearing unit 34 is fixed to the lower surface of the rotary table 2 via the cylindrical body 33. However, the fixing structure of the bearing unit 34 may be configured as follows. A plurality of, for example, six support arms radially extending horizontally along the circumferential direction are provided in the upper portion of the rotary shaft (revolution shaft) 21, and the rotary table 2 is mounted on the support arms. The portion of the rotary table 2 corresponding to the rotation shaft 32 is formed as a hole portion. A support rod extending vertically is provided on the lower surface of each support arm. The lower end of the support rod is extended to the lower side of the bottom portion 131 of the container body 13 via the hole portion 130. A ring body formed along a circle connecting the respective support rods is fixed to the lower ends of the respective support rods. The bearing unit 34 is fixed to the lower surface of the ring body, and the rotation shaft 32 is allowed to protrude from the bearing unit 34 to the lower surface of the mounting stand 3 through a through-hole formed in the ring body. Therefore, the bearing unit 34 is fixed to the support arm via the ring body and the support rod and is revolved by the rotation of the rotary shaft 21. As viewed in a plan view, the rotation shafts 32 and the support rods described above are alternately arranged in the circumferential direction.

Figure 11:
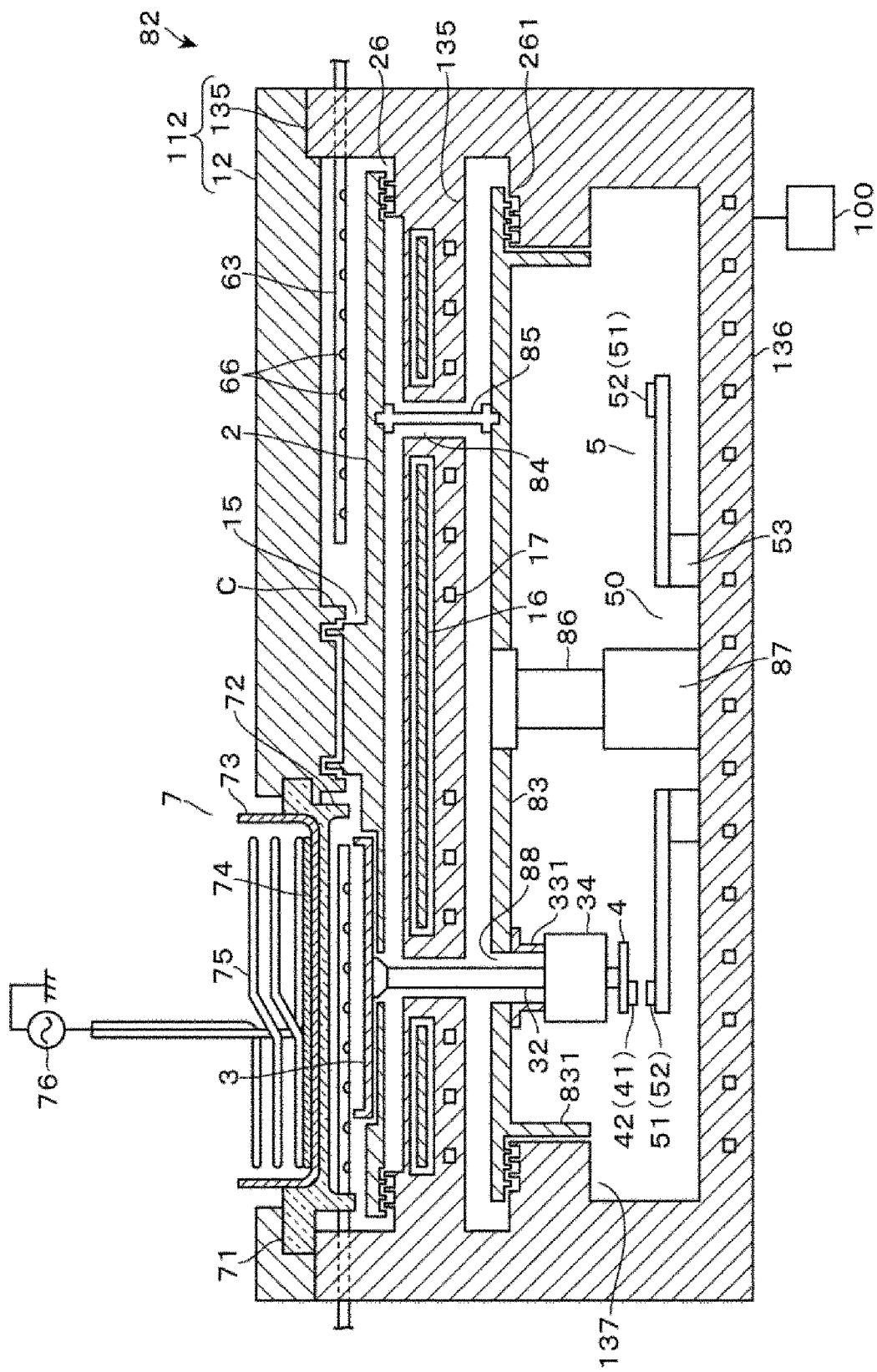
FIG. 11 is a vertical sectional side view showing a further example of a film forming apparatus to which a substrate processing apparatus according to the present disclosure is applied.

A further example of the film forming apparatus to which the substrate processing apparatus of the present disclosure is applied will be described with reference to FIG. 11. This film forming apparatus 82 is suitable for, for example, a case where a film forming process is performed at a film forming process temperature of 200 degrees C. or more, for example, 400 degrees C. The difference between the film forming apparatus 82 and the film forming apparatus 1 shown in FIG. 1 will now be described. The rotary table 2 of this example is supported from the lower side by a disc-shaped support plate 83. The support plate 83 is configured to support the mounting stand 3 independently of the rotary table 2.

In the vacuum container 112 of this example, a partition wall portion 135 is formed so as to face the bottom portion 136. The rotary table 2 is provided above the partition wall portion 135. The support plate 83 is provided below the partition wall portion 135. A heater 16 and a coolant flow path 17 are provided in the partition wall portion 135. An annular slit 84 is formed in the partition wall portion 135. In the lower surface of the rotary table 2, a plurality of support columns 85 is provided in the circumferential direction so as to extend vertically downward from a position corresponding to the slit 84. Each support column 85 passes through the slit 84 and is connected to the support plate 83. The lower surface side central portion of the support plate 83 is connected to a revolution-purpose rotating mechanism 87 via a rotary shaft 86. Accordingly, when the rotary shaft 86 is rotated, the rotary table 2 rotates about a vertical axis via the support plate 83 and the support columns 85.

The rotation shaft 32 of the mounting stand 3 penetrates the slit 84 of the partition wall portion 135 and the opening 88 of the support plate 83 and extends downward. The rotation shaft 32 is connected to the bearing unit 34 fixed to the lower side of the support plate 83 via the cylindrical body 331. The configuration of the driven gear 4 and the driving gear 5, the revolution-purpose rotating mechanism 87 provided inside the opening 50 of the driving gear 5, and the like are the same as those of the film forming apparatus 1 shown in FIG. 1. The side wall portion of the vacuum container 112 in the vicinity of the lower surface of the support plate 83 constitutes a protruding portion 137 protruding into the vacuum container 112. A labyrinth seal portion 261 is formed between the lower surface of the support plate 83 and the upper surface of the protruding portion 137. Furthermore, a cylindrical wall portion 831 is formed inside the labyrinth seal portion 261 so as to extend downward from the lower surface of the support plate 83. A narrow gap is formed between the protruding portion 137 and the cylindrical wall portion 831.

The labyrinth seal portion 261 and the cylindrical wall portion 831 restrain various kinds of gases from entering the space above the support plate 83 from the upper side of the support plate 83. Even when particles are generated in the bearing unit 34, the revolution-purpose rotating mechanism 87 and the rotation-purpose rotating mechanism 53, the labyrinth seal portion 261 and the cylindrical wall portion 831 prevent the particles from entering the space above the support plate 83. Other configurations are the same as those of the film forming apparatus 1 shown in FIG. 1. The same constituent members are denoted by the same reference numerals and the description thereof is omitted.

Even in this film forming apparatus 82, the mounting stand 3 is rotated on its own axis by rotating the driving gear 5. Therefore, it is possible to improve the uniformity of the film forming process in the circumferential direction of the wafer W. The heater 16 is provided above the support plate 83. The revolution-purpose rotating mechanism 87 and the rotation-purpose rotating mechanism 53 are provided below the support plate 83. Since the heater 16 is separated from the revolution-purpose rotating mechanism 87 and the rotation-purpose rotating mechanism 53, the film forming apparatus 82 is suitable for a film forming process performed at a high temperature of, for example, 400 degrees C.

The present disclosure described above encompasses a case where only one of the driven gear 4 and the driving gear 5 is a magnetic body. Furthermore, the present disclosure encompasses a case where the driven gear 4 is formed of one of the N pole portions 41 and the S pole portions 42 or formed of the N pole portions 41 and the S pole portions 42 alternately arranged, and the driving gear 5 is made of a magnetic material. Moreover, the present disclosure encompasses a case where the driving gear 5 is formed of one of the N pole portions 51 and the S pole portions 52 or formed of the N pole portions 51 and the S pole portions 52 alternately arranged, and the driven gear 4 is made of a magnetic material. In the case where the driven gear 4 and the driving gear 5 are provided as in the above-described embodiment, the mounting stand 3 is rotated on its own axis by using the repulsion force and the attraction force of magnets. Therefore, it is possible to reliably rotate the mounting stand 3. However, if only one of the driven gear 4 and the driving gear 5 is a magnetic body, it is preferable that the mounting stand 3 is lightweight in order to reliably rotate mounting stand 3.

EXAMPLE

Subsequently, evaluation tests will be described.

Evaluation Test 1

An evaluation test was conducted using the film forming apparatus 1 shown in FIG. 1, in which the driving gear 5 is formed of 300 magnetic pole portions (N pole portions 51 and S pole portions 52), the driven gear 4 is formed of 18 magnetic pole portions (N pole portions 41 and S pole portions 42), and the distance between the driving gear 5 and the driven gear 4 is set to 3.1 mm. The wafers W were mounted on the five mounting stands 3, and the rotary table 2 was rotated clockwise at 30 rpm. As for a case where the revolution number of the driving gear 5 goes ahead by 0.1 degree/second (6 degrees/minute) and a case where the revolution number of the driving gear 5 lags behind by 0.1 degree/second (6 degrees/minute), the rotation operation of each wafer W was confirmed by measuring the rotation angle of each wafer W. The rotation angle was measured with a wireless real-time rotation measuring instrument.

When the revolution number of the driving gear 5 and the revolution number of the rotary table 2 are the same, it was recognized that each wafer W stops its rotation. In addition, when the revolution number of the driving gear 5 goes ahead, it was recognized that the five wafers W are simultaneously rotated clockwise. While the rotary table 2 makes one revolution, it was confirmed that the wafers W of the respective mounting stands 3 are rotated by 3.35 degrees, 3.34 degrees, 3.34 degrees, 3.34 degrees and 3.34 degrees, respectively, and the five wafers W are rotated clockwise at 0.28 rpm almost in the same way. On the other hand, when the revolution number of the driving gear 5 lags behind, it was recognized that the five wafers W are simultaneously rotated counterclockwise. While the rotary table 2 makes one revolution, it was confirmed that the wafers W of the respective mounting stands 3 are rotated by 3.32 degrees, 3.31 degrees, 3.32 degrees, 3.32 degrees and 3.31 degrees, respectively, and the five wafers W are rotated counterclockwise at 0.28 rpm almost in the same way.

As for a case of changing the revolution number of the rotary table 2 to 60 rpm, the rotation operation of each wafer W was confirmed in a similar manner Conditions other than the revolution number of the rotary table 2 are the same as in evaluation test 1. Even in this case, it was confirmed that when the revolution number of the driving gear 5 and the revolution number of the rotary table 2 are the same, the rotation of each wafer W is stopped. It was confirmed that when the revolution number of the driving gear 5 goes ahead, the five wafers W are simultaneously rotated clockwise at 0.28 rpm. It was confirmed that when the revolution number of the driving gear 5 lags behind, the five wafers W are simultaneously rotated at 0.28 rpm counterclockwise.

Evaluation Test 2

In the same film forming apparatus as in evaluation test 1, the wafers W were mounted on the respective mounting stands 3, the rotary table 2 was rotated clockwise at 30 rpm and 60 rpm, respectively, and the rotation speed difference between the driving gear 5 and the rotary table 2 was changed between −0.8 degrees/second and 0.8 degrees/second. The rotation of each wafer W was evaluated. As described above, the rotation speed difference refers to the velocity difference between the angular velocity of the driving gear 5 and the angular velocity (revolution angular velocity) of the driven gear 4 due to the rotation of the rotary table 2.

Figure 12:
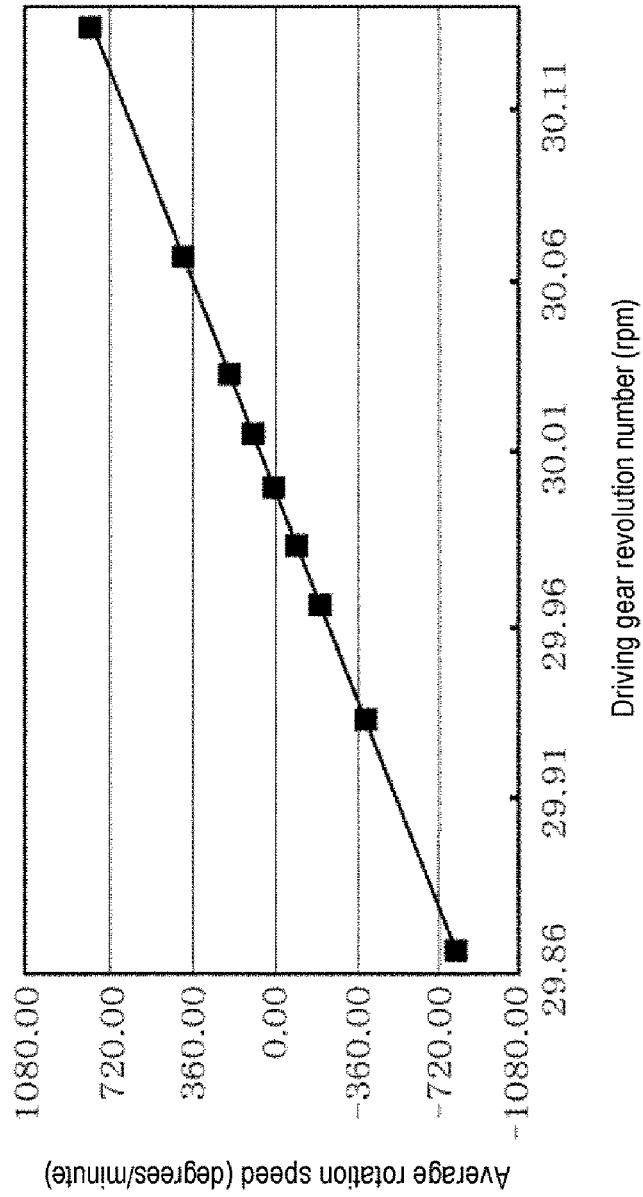
FIG. 12 is a characteristic diagram showing the results of an evaluation test according to the present disclosure.
Figure 13:
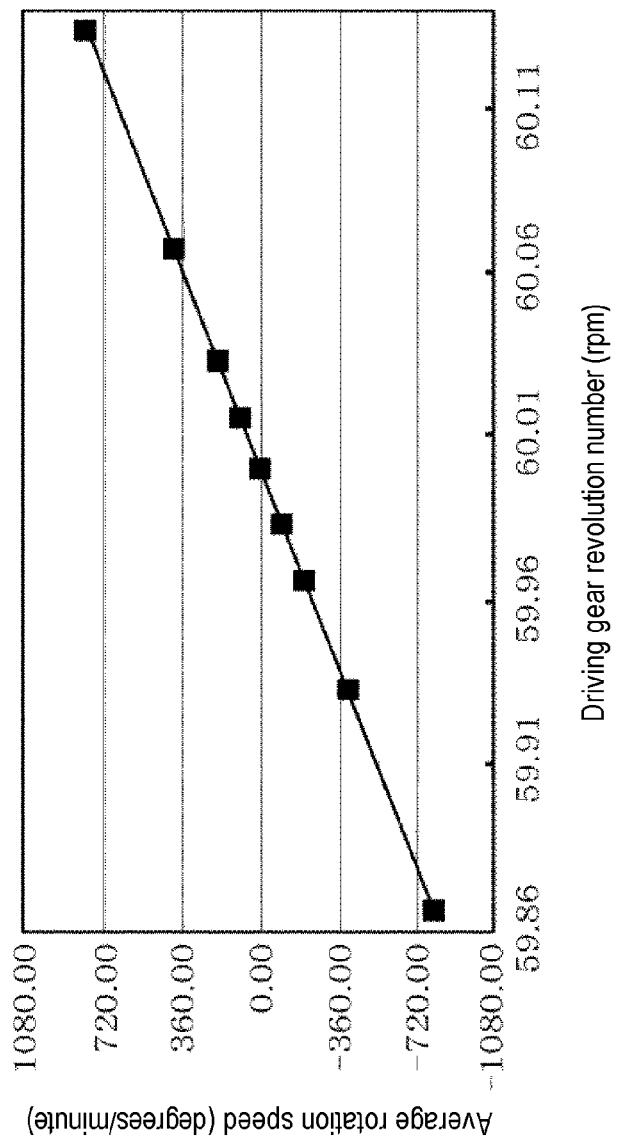
FIG. 13 is a characteristic diagram showing the results of an evaluation test according to the present disclosure.

FIG. 12 shows the measurement results when the revolution number of the rotary table 2 is 30 rpm, and FIG. 13 shows the measurement results when the revolution number is 60 rpm. In FIGS. 12 and 13, the horizontal axis represents the revolution number (rpm) of the driving gear 5, and the vertical axis represents the average rotation speed (degrees/minute) of the five wafers W. The above-described rotation speed difference can be obtained by subtracting the revolution number of the rotary table 2 from the revolution number of the driving gear 5. Therefore, it was recognized that the rotation speed difference and the rotation speed of the driven gear 4 are maintained in a proportional relationship. It was also confirmed that the rotation speed difference and the rotation speed of the driven gear 4 are maintained in the same proportional relationship even if the revolution number of the rotary table 2 is changed to 30 rpm and 60 rpm. Thus, it is understood that the rotation number (rotation speed) of the driven gear 4 is determined by the rotation speed difference (the velocity difference between the angular velocity of the driving gear 5 and the angular velocity of the driven gear 4 due to the rotation of the rotary table 2) and the gear ratio of the driving gear 5 and the driven gear 4.

Evaluation Test 3

Figure 14:
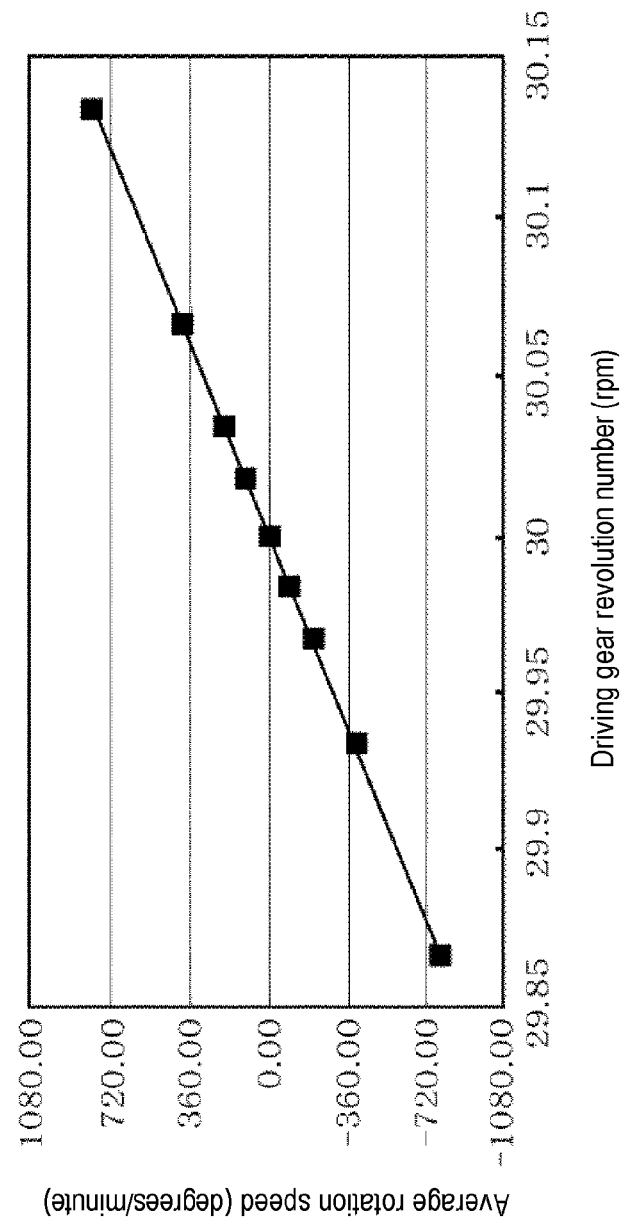
FIG. 14 is a characteristic diagram showing the results of an evaluation test according to the present disclosure.
Figure 15:
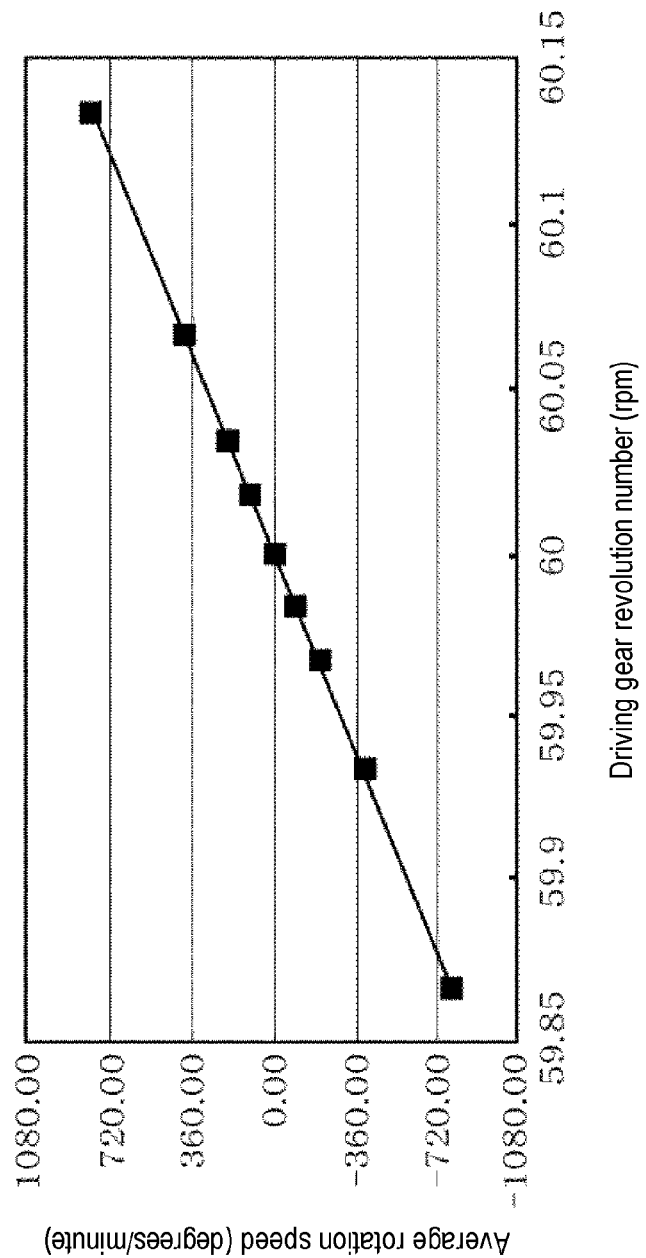
FIG. 15 is a characteristic diagram showing the results of an evaluation test according to the present disclosure.
Figure 16:
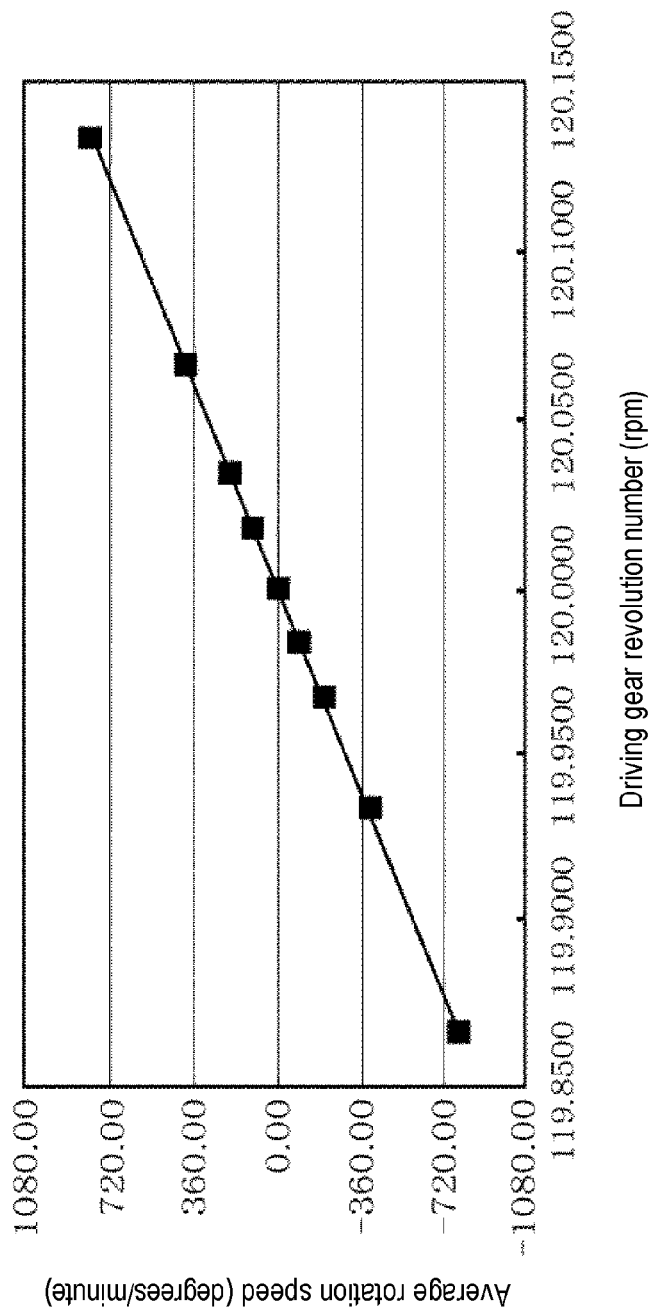
FIG. 16 is a characteristic diagram showing the results of an evaluation test according to the present disclosure.

The rotation of the wafer W was evaluated in the same manner as in evaluation test 2 except that the distance between the driven gear 4 and the driving gear 5 is set to 5 mm and the measurement was also performed for the case where the revolution number of the rotary table 2 is 120 rpm. FIG. 14 shows the evaluation results when the revolution number of the rotary table 2 is 30 rpm, FIG. 15 shows the evaluation results when the revolution number of the rotary table 2 is 60 rpm, and FIG. 16 shows the evaluation results when the revolution number of the rotary table 2 is 120 rpm. In FIGS. 14 to 16, the horizontal axis represents the revolution number (rpm) of the driving gear 5, and the vertical axis represents the average rotation speed (degrees/minute) of the five wafers W. As a result, it was recognized that even when the distance between the driven gear 4 and the driving gear 5 is changed from 3.1 mm to 5 mm, the relationship between the rotation speed difference and the rotation speed of the driven gear 4 are matched well with each other.

Figure 17:
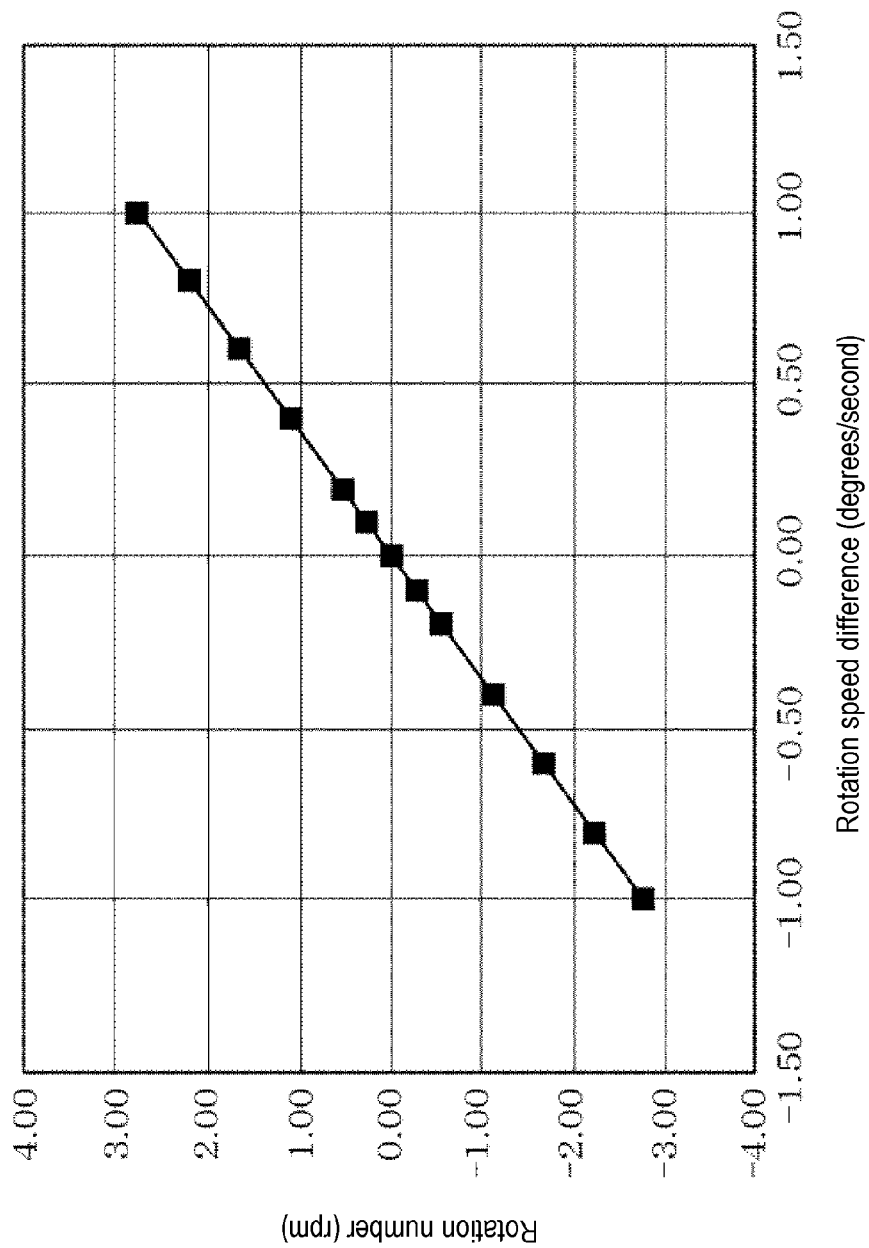
FIG. 17 is a characteristic diagram showing the results of an evaluation test according to the present disclosure.
Figure 18:
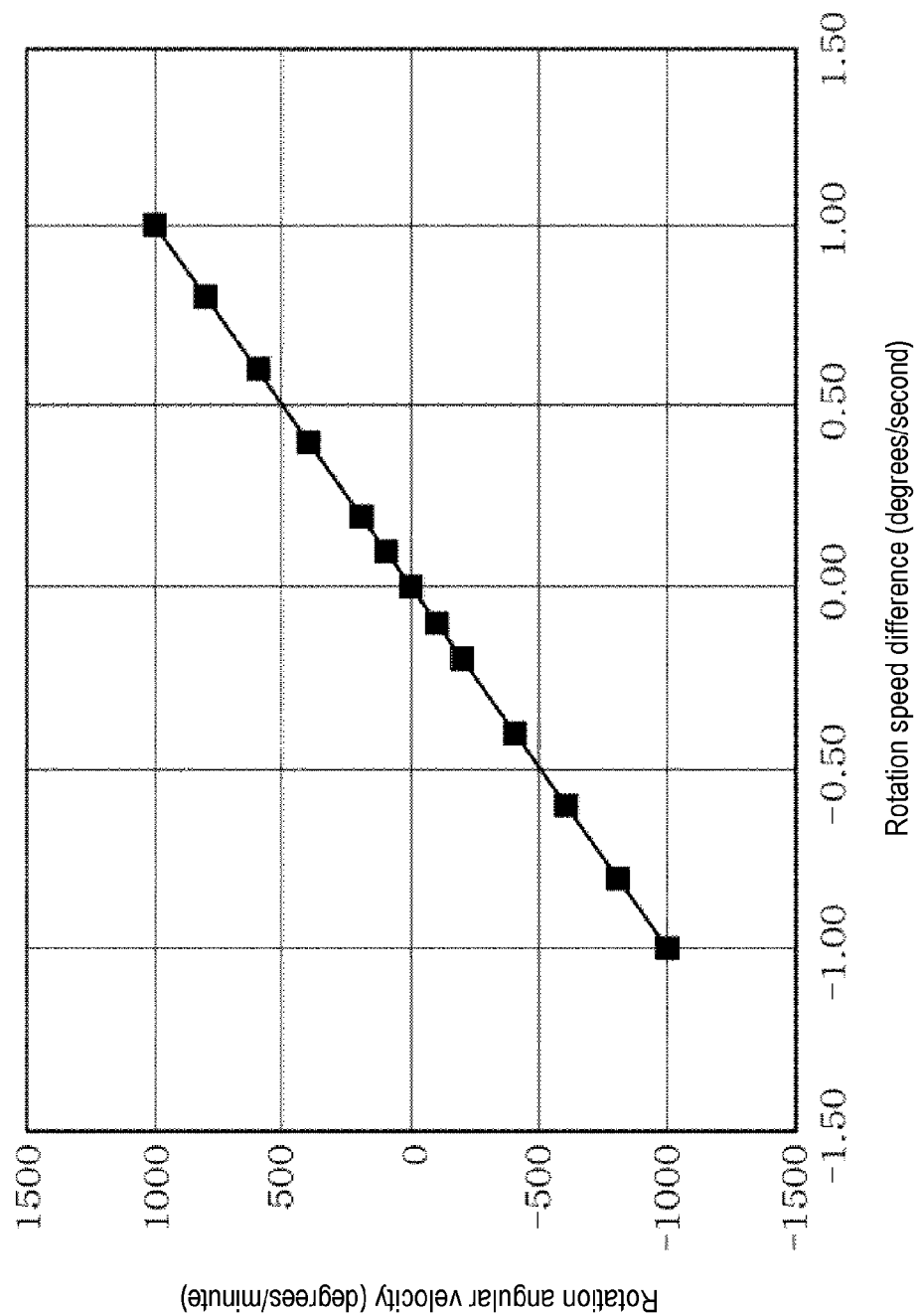
FIG. 18 is a characteristic diagram showing the results of an evaluation test according to the present disclosure.

FIG. 17 shows the rotation speed difference and the theoretical value of the rotation number of the driven gear 4 obtained from the gear ratio of the driving gear 5 and the driven gear 4, and FIG. 18 shows the rotation speed difference and the theoretical value of the rotation angular velocity of the driven gear 4 obtained from the gear ratio of the driving gear 5 and the driven gear 4. In FIGS. 17 and 18, the horizontal axis represents the rotation speed difference (degrees/second). The vertical axis in FIG. 17 represents the rotation number (rpm), and the vertical axis in FIG. 18 represents the rotation angular velocity (degrees/minute). As a result, it was confirmed that the theoretical value is matched well with the actual measurement result.

According to the present disclosure in some embodiments, in order to perform the film forming process with respect to the substrates mounted on the mounting stands on one surface side of the rotary table while revolving the substrates, the driven gears are provided on the rotation shafts of the mounting stands, and the driving gear constituting a magnetic gear mechanism with the driven gears is provided along the entire circumference of the revolution trajectory of the driven gears. Therefore, the mounting stands are rotated on their own axes by rotating the driving gear. This makes it possible to improve the uniformity of the film forming process in the circumferential direction of the substrate. In addition, the rotation speed of the driven gears can be easily adjusted by adjusting the difference between the angular velocity of the driving gear and the angular velocity of the driven gears.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus for performing film formation by supplying a processing gas to a substrate, comprising:
   a rotary table provided in a processing container;
   a mounting stand provided to mount the substrate on one surface side of the rotary table and configured to be revolved by rotating the rotary table;
   a processing gas supply part configured to supply a processing gas to a region through which the mounting stand passes by the rotation of the rotary table;
   a rotation shaft rotatably provided in a portion rotating together with the rotary table and configured to support the mounting stand;
   a magnetic gear mechanism including:
      a rotatable driven gear provided on the rotation shaft, and including a disk-shaped plate; and
      a rotatable driving gear provided below the driven gear, and including an annular plate-like member provided along an entire circumference of a revolution trajectory of the driven gear so as to overlap the revolution trajectory of the driven gear in a vertical direction;
   a rotating mechanism configured to rotate the driving gear; and
   a controller:
      including a memory part, an input part, and a data processing part, which are connected to one another;
      storing, in the memory part, a predetermined relationship between a rotation speed of the driven gear and a velocity difference between an angular velocity of the driven gear due to revolution and an angular velocity of the driving gear; and
      configured to set, by the data processing part, a revolution number of the driving gear based on the rotation speed inputted to the input part, a revolution number of the rotary table and the predetermined relationship stored in the memory part,
   wherein the angular velocity of the driving gear is set between a value at which an absolute value of the velocity difference is zero and a value at which the velocity difference and the rotation speed of the driven gear are maintained in a substantially proportional relationship.

2. The apparatus of claim 1, wherein the driven gear includes N pole portions and S pole portions arranged alternately along a rotation direction of the driven gear over an entire circumference of the driven gear, and
   the driving gear includes N pole portions and S pole portions arranged alternately along the revolution trajectory over an entire circumference of the driving gear.

3. The apparatus of claim 1, wherein the driven gear and the driving gear include magnetic pole portions formed of permanent magnets.

4. The apparatus of claim 1, wherein an interior of the processing container is configured to be in a vacuum atmosphere,
   the driving gear is provided on an air atmosphere side, and
   a partition member is provided between the driven gear and the driving gear, the partition member configured to partition the air atmosphere and the vacuum atmosphere and made of a material that allows a magnetic force line to pass therethrough.

5. The apparatus of claim 1, further comprising:
the controller connected to the rotating mechanism is configured to rotate the driving gear, and
the controller is configured to transmit a rotation speed control signal to the rotating mechanism, and the rotation speed control signal corresponds to the set revolution number of the driving gear.

6. The apparatus of claim 1, wherein the driven gear further includes magnetic pole portions provided on a lower surface of the disk-shaped plate so as to extend radially from a central portion of the lower surface in a lateral direction, and
wherein the driving gear further includes magnetic pole portions arranged on an upper surface of the annular plate-like member along an outer circumference of the revolution trajectory of the driven gear, the upper surface of the annular plate-like member being located opposite the lower surface of the disk-shaped plate.

* * * * *